(12) United States Patent
Campbell

(10) Patent No.: US 12,040,759 B2
(45) Date of Patent: Jul. 16, 2024

(54) POWER RECONFIGURABLE POWER AMPLIFIER

(71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 363 days.

(21) Appl. No.: 17/365,672

(22) Filed: Jul. 1, 2021

(65) Prior Publication Data

US 2023/0006624 A1  Jan. 5, 2023

(51) Int. Cl.
*H03F 3/60* (2006.01)
*H03F 3/195* (2006.01)
*H03F 3/24* (2006.01)

(52) U.S. Cl.
CPC ............. *H03F 3/604* (2013.01); *H03F 3/195* (2013.01); *H03F 3/245* (2013.01);
(Continued)

(58) Field of Classification Search
CPC .......... H03F 3/604; H03F 3/195; H03F 3/245; H03F 2200/198; H03F 2200/451;
(Continued)

(56) References Cited

U.S. PATENT DOCUMENTS

| 5,428,320 A | 6/1995 | Lindberg et al. |
| 5,610,556 A * | 3/1997 | Rubin ............... H03F 3/602 330/124 R |

(Continued)

OTHER PUBLICATIONS

Quayle Action for U.S. Appl. No. 17/365,631, mailed May 27, 2022, 5 pages.
(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

Disclosed is a reconfigurable power amplifier having a $2^N-1$ number of input-side reconfigurable quadrature couplers connected in a tree structure, wherein a $2^{(N-1)}$ number of the input-side reconfigurable quadrature couplers have coupler output terminals, and a root of the tree structure is one of the input-side reconfigurable quadrature couplers having a main input terminal. Also included is a $2^N-1$ number of output-side reconfigurable quadrature couplers connected in a tree structure, wherein a $2^{(N-1)}$ number of the output-side reconfigurable quadrature couplers have coupler input terminals, and a root of the tree structure is one of the output-side reconfigurable quadrature couplers having a main output terminal. Further included is a $2^N$ number of constituent amplifiers divided into amplifier pairs having amplifier input terminals connected to corresponding ones of the coupler output terminals and having amplifier output terminals coupled to corresponding ones of the coupler input terminals.

21 Claims, 27 Drawing Sheets

(52) U.S. Cl.
CPC .. *H03F 2200/198* (2013.01); *H03F 2200/451* (2013.01); *H03F 2200/537* (2013.01); *H03F 2200/543* (2013.01)

(58) Field of Classification Search
CPC ......... H03F 2200/537; H03F 2200/543; H03F 1/0277; H03F 2200/204
USPC ............................................ 330/295, 53, 84
See application file for complete search history.

(56) References Cited

U.S. PATENT DOCUMENTS

| | | |
|---|---|---|
| 7,570,932 B1 | 8/2009 | Folkmann |
| 9,319,006 B2 * | 4/2016 | Solomko ................. H03F 3/195 |
| 2007/0008132 A1 | 1/2007 | Bellatoni |
| 2017/0019071 A1 | 1/2017 | Kobayashi et al. |

OTHER PUBLICATIONS

Quayle Action for U.S. Appl. No. 18/055,449, mailed Mar. 7, 2023, 5 pages.

Lehmann et al. "Reconfigurable PA Networks using Switchable Directional Couplers as RF Switch" Proceedings of the 37th European Microwave Conference, IEEE, Oct. 2007, Munich Germany, pp. 1054-1057.

\* cited by examiner

POWER RECONFIGURABLE POWER AMPLIFIER

RELATED APPLICATIONS

This application is related to U.S. patent application Ser. No. 17/365,631, filed Jul. 1, 2021, now U.S. Pat. No. 11,539,108, the disclosure of which is hereby incorporated herein by reference in its entirety.

FIELD OF THE DISCLOSURE

The present disclosure relates to radio frequency power amplifiers that employ quadrature couplers.

BACKGROUND

Many phased array antenna systems utilize an element power taper across the surface of the array. This places significant constraints on the power amplifiers driving the radiating elements as different output power levels are required without sacrificing efficiency. Existing solutions operate the power amplifier in back-off, use multiple power amplifier designs, or adjust the power supply voltage. These approaches can result in reduced efficiency and significant mismatch in the amplitude and phase transfer characteristics for amplifiers operating at different power levels. What is needed is a power reconfigurable power amplifier architecture that provides evenly stepped output power levels in watts without a large reduction in power-added efficiency for the lower power states.

SUMMARY

Disclosed is a reconfigurable power amplifier having a $2^N-1$ number of input-side reconfigurable quadrature couplers connected in a tree structure, wherein a $2^{(N-1)}$ number of the input-side reconfigurable quadrature couplers have coupler output terminals, and a root of the tree structure is one of the input-side reconfigurable quadrature couplers having a main input terminal. Also included is a $2^N-1$ number of output-side reconfigurable quadrature couplers connected in a tree structure, wherein a $2^{(N-1)}$ number of the output-side reconfigurable quadrature couplers have coupler input terminals, and a root of the tree structure is one of the output-side reconfigurable quadrature couplers having a main output terminal. Further included is $2^N$ number of constituent amplifiers divided into amplifier pairs having amplifier input terminals connected to corresponding ones of the coupler output terminals and having amplifier output terminals coupled to corresponding ones of the coupler input terminals. The number N is a natural counting number.

In some embodiments, each of the input-side and output-side reconfigurable quadrature couplers includes a first port transmission line connected to a first port, and a second port transmission line and a second port transformer connected between the second port transmission line and a second port. The second port transformer is configured to have a selectable second port reflection coefficient. Each of the input-side and output-side reconfigurable quadrature couplers further includes a third port transmission line and a third port transformer connected between the third transmission line and a third port. The third port transformer is configured to have a selectable third port reflection coefficient. Also included is a fourth port transmission line and a fourth port transformer connected between the fourth port transmission line and a fourth port. The fourth port transformer is configured to have a selectable fourth port reflection coefficient.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1A:
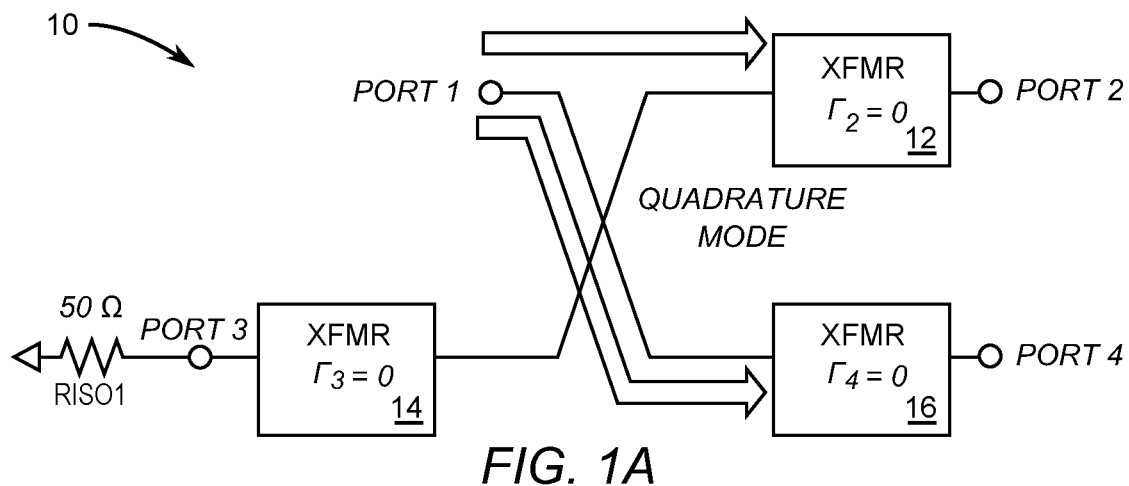
FIG. 1A is a simplified diagram of a three-mode reconfigurable quadrature coupler that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Many phased array antenna systems utilize an element power taper across the surface of the array. This requirement places significant constraints on the power amplifiers used to drive the radiating elements. Different output power levels are required without sacrificing power-added efficiency. One approach is to vary the power amplifier supply voltage, VD. This requires controlling the high-power supply of independent array elements. Also, power amplifier gain and compression characteristics start to change if VD is significantly varied. Another approach is to use separate power amplifiers designed for different power levels, increasing design expense, different interface boards, assembly complexity, and bill of materials management. The situation is further complicated if the signal being transmitted has a significant peak-to-average ratio. Static phase and amplitude differences between individual amplifiers can be calibrated with the onboard digital attenuators and phase shifters. Dynamic phase changes resulting from the amplifier's inherent amplitude modulation—amplitude modulation (AM/AM) and amplitude modulation—phase modulation (AM/PM) characteristics cannot be calibrated. This significantly impacts dynamic sidelobe levels as the modulated signal moves from peaks to valleys unless all of the amplifiers have similar AM/AM and AM/PM characteristics. In other words, if the array power taper requires four different power levels, then four different power amplifier designs are required that have matched AM/AM and AM/PM characteristics.

Disclosed is a power reconfigurable amplifier architecture that provides $2^N$ evenly stepped output power levels in watts. Exemplary embodiments utilize an N-level of nested reconfigurable Lange couplers optimized for either quadrature/through or quadrature/coupled operation. The N-level of nested reconfigurable Lange couplers total in number by the relation $2X(2^N-1)$, which accounts for both input-side and output-side couplers. Further disclosed is a power reconfigurable power amplifier architecture that provides evenly stepped output power levels in watts without a large reduction in power-added efficiency for lower power states. The present disclosure utilizes the N-level of nested reconfigurable Lange couplers providing $2^N$ output power levels and 3.01 N dB of range. The disclosed topology inherently exhibits closely matched AM-AM and AM-PM transfer characteristics.

FIG. 1A is a simplified diagram of a three-mode reconfigurable quadrature coupler 10 that is structured in accordance with the present disclosure. The reconfigurable quadrature coupler 10 includes a first port (PORT 1) and a second port (PORT 2) coupled to a PORT 2 transformer 12. The PORT 2 transformer 12 is configured to have a selectable second port reflection coefficient $\Gamma_2$. The reconfigurable quadrature coupler 10 further includes a third port (PORT 3) connected to a PORT 3 transformer 14. The PORT 3 transformer 14 is configured to have a selectable third port reflection coefficient $\Gamma_3$. An isolation resistor RISO1 may be connected between PORT 3 and ground. A fourth port (PORT 4) is connected to a PORT 4 transformer 16.

The PORT 4 transformer 16 is configured to have a selectable fourth port reflection coefficient $\Gamma_4$. In exemplary embodiments, such as depicted in FIG. 1A, the quadrature coupler 10 is of the Lange coupler type.

FIG. 1A depicts the reconfigurable quadrature coupler 10 in quadrature mode with a first quadrature signal path indicated by a first large arrow between PORT 1 and PORT 2, along with a second quadrature signal path indicated by a second large arrow between PORT 1 and PORT 4. The phase relationship between the through and coupled modes is the same as what occurs for normal quadrature operation with the through path being −90° phase shifted from the coupled path. This is a key property for this circuit as the couplers can be reconfigured in a balanced amplifier architecture without altering the natural phase relationships.

Figure 1B:
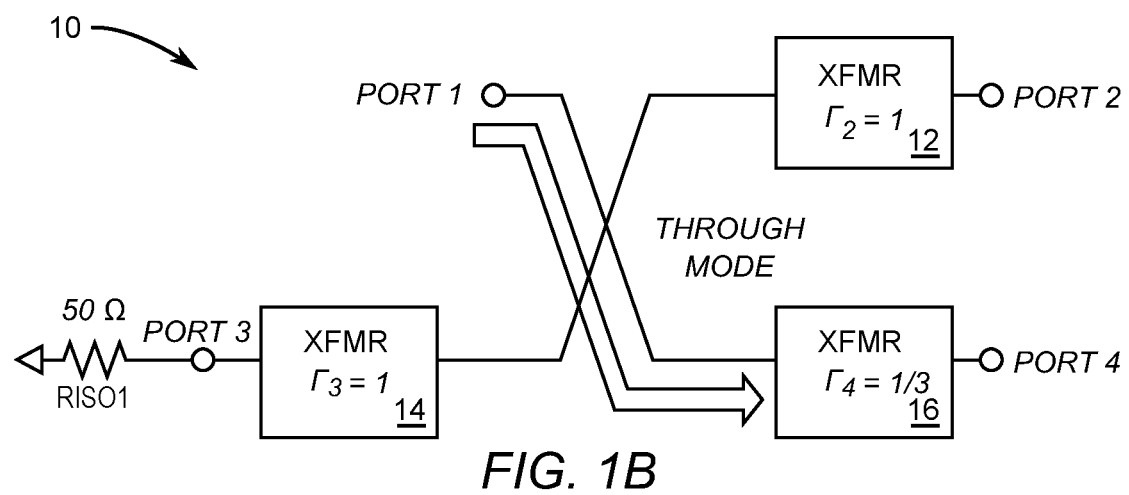
FIG. 1B depicts the reconfigurable quadrature coupler in a through mode.

FIG. 1B depicts the reconfigurable quadrature coupler 10 in a through mode with a through mode signal path indicated by a large arrow between PORT 1 and PORT 4. First, consider that in the through mode of operation all of PORT 1 input power is directed to PORT 4. For this to occur there can be no power dissipation in the PORT 2 transformer 12 and the PORT 3 transformer 14. Terminating impedances associated with PORT 2 and PORT 3 must produce unity magnitude reflection coefficients such that all of the energy is reflected back into the quadrature coupler 10.

Figure 1C:
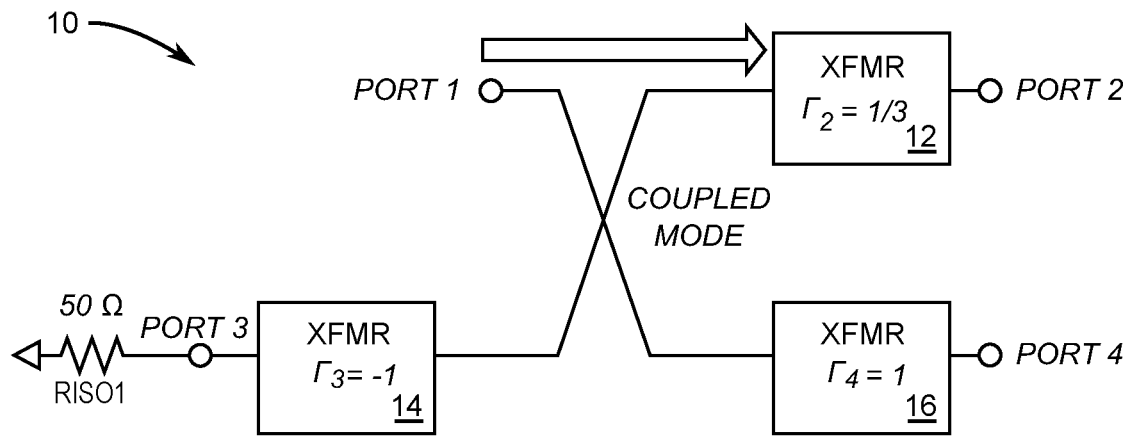
FIG. 1C depicts the reconfigurable quadrature coupler in a coupled mode.

FIG. 1C depicts the reconfigurable quadrature coupler 10 in the coupled mode with a coupled mode signal path indicated by a large arrow between PORT 1 and PORT 2. For lossless power transfer from PORT 1 to PORT 2 and PORT 1 to PORT 4, PORT 1 must be matched such that $\Gamma_1=0$. A required value for the port 4 reflection coefficient $\Gamma_4$ is set by reconfiguration of the fourth port transformer 16 for through mode operation.

Reconfigurable power amplifiers of the present disclosure each utilize N nested pairs of reconfigurable Lange couplers. Unlike related-art designs, the reconfigurable quadrature coupler 10 can be reconfigured to operate in one of three modes: quadrature mode, through mode, and coupled mode. The quadrature mode equally splits the input signal into quadrature outputs and requires a 500 termination on all four ports (PORT 1 through PORT 4) of the reconfigurable quadrature coupler 10. By reconfiguring the terminating impedances connected to three of the coupler ports, all the power can be directed to PORT 4 or to the PORT 2. FIGS. 1A, 1B, and 1C each show one of many possible combinations of terminating impedances. For example, magnitudes are unity or ⅓ but the phases must satisfy $$e^{j\phi_2}-|\Gamma_4|e^{j\phi_4}-2|\Gamma_2|e^{j(\phi_2+\phi_3+\phi_4)}=0$$

for the through mode and must satisfy $$|\Gamma_2|e^{j\phi_2}-e^{j\phi_4}-2|\Gamma_2|e^{j(\phi_2+\phi_3+\phi_4)}=0$$

for the coupled mode. The reflection coefficients equal 1 and −1 in the 0 degree and 180 degree cases, respectively. There are an infinite number of other combinations that will produce identical results.

The through and coupled modes are quadrature to each other, which enables power reconfigurable amplifier architectures using one or more pairs of reconfigurable quadrature coupler 10 of the Lange coupler type.

Figure 2A:
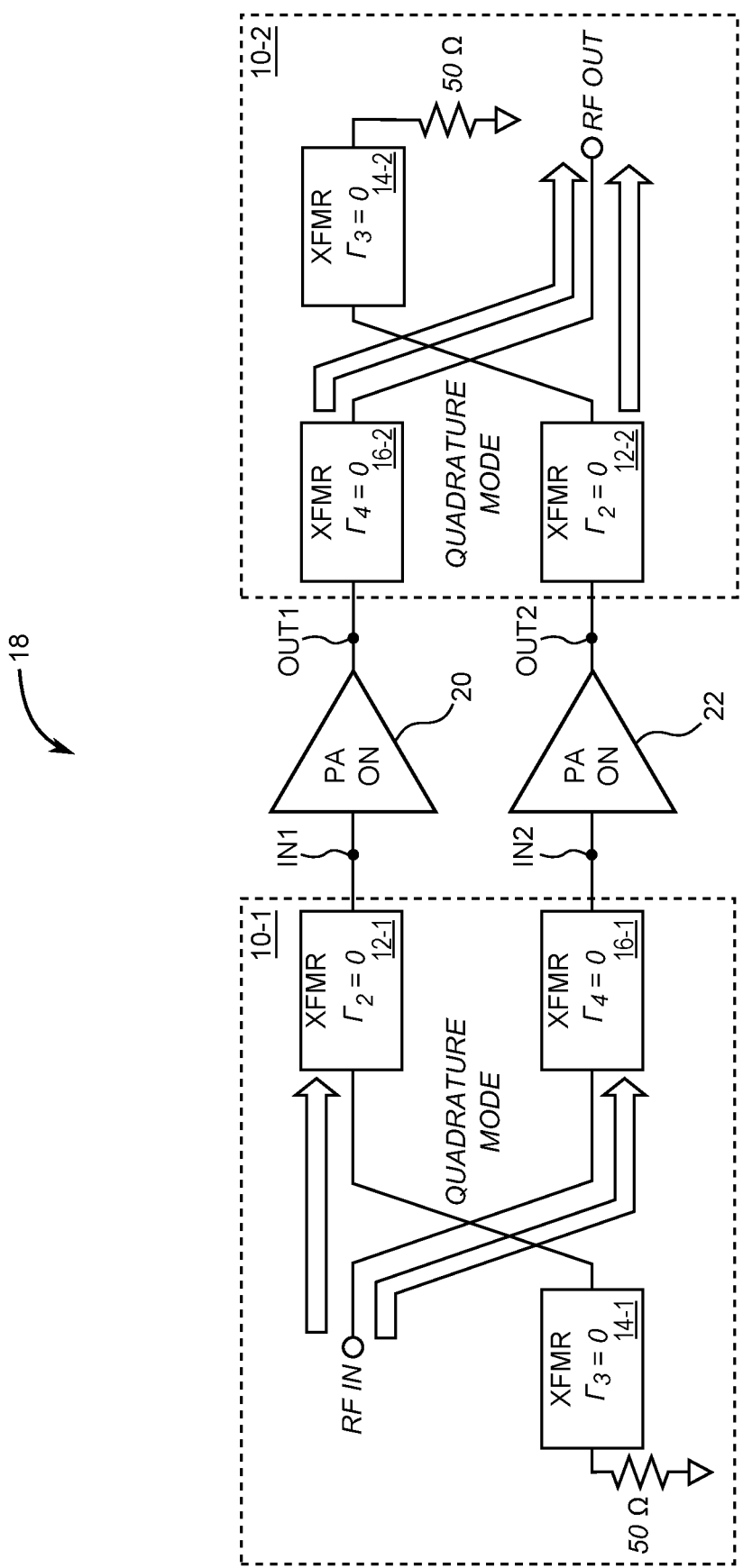
FIG. 2A is a schematic of an exemplary embodiment of a reconfigurable power amplifier that is structured in accordance with the present disclosure and operated at 100% power.
Figure 2B:
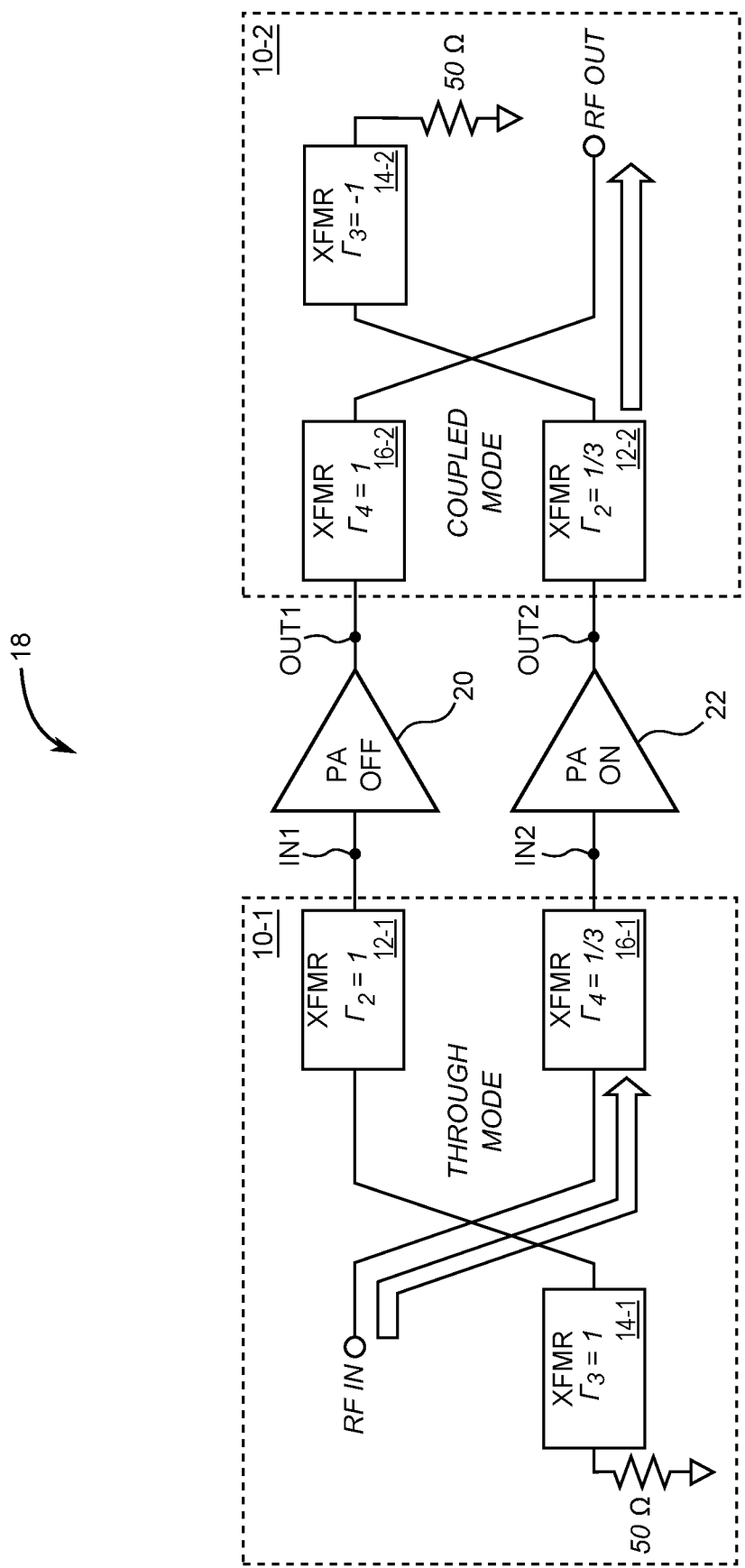
FIG. 2B is a schematic of the exemplary embodiment of the reconfigurable power amplifier that is operated at 50% power.

To illustrate how the reconfigurable quadrature coupler 10 is used in a reconfigurable power amplifier 18, consider the two-level power examples shown in FIG. 2A and FIG. 2B. In these two exemplary embodiments, an upper power amplifier 20 and a lower power amplifier 22 are connected between an input quadrature coupler 10-1 and an output quadrature coupler 10-2. The upper power amplifier 20 has a first input IN1 connected to a first PORT 2 transformer 12-1 and a first output OUT1 connected to a second PORT 4 transformer 16-2. The lower power amplifier 22 has a second input IN2 connected to the first PORT 4 transformer 16-1 and a second output OUT2 connected to the second PORT 2 transformer 12-2. A first PORT 3 transformer 14-1 is configured as an isolation transformer and in this embodiment is coupled to ground through a 50Ω isolation resistor. A second PORT 3 transformer 14-2 is also configured as an isolation transformer and in this embodiment is also coupled to ground through another 500 isolation resistor.

The operational embodiments of the reconfigurable power amplifier 18 are monolithically implemented and otherwise assumed to be identical. The 100% output power quadrature mode of operation is shown in FIG. 2A. However, as depicted in FIG. 2B, by setting the input quadrature coupler 10-1 to the through mode, all of the input power is directed to the lower power amplifier 22. Relatively very little input power is incident to the upper power amplifier 20, which can be disabled with gate bias without self-bias effects due to input drive. The output quadrature coupler 10-2 is set to the coupled mode directing the output from the lower power amplifier 22 to the RF output port (RF OUT) of the reconfigurable power amplifier 10-2. If the amplifier input power is reduced by 3 dB, the lower power amplifier 22 experiences the same RF drive as that for the quadrature mode. The overall amplifier output power is reduced by 50% while the gain and power-added efficiency remain unaltered. This scenario is depicted in FIG. 2B for one possible set of terminating impedances.

Figure 3A:
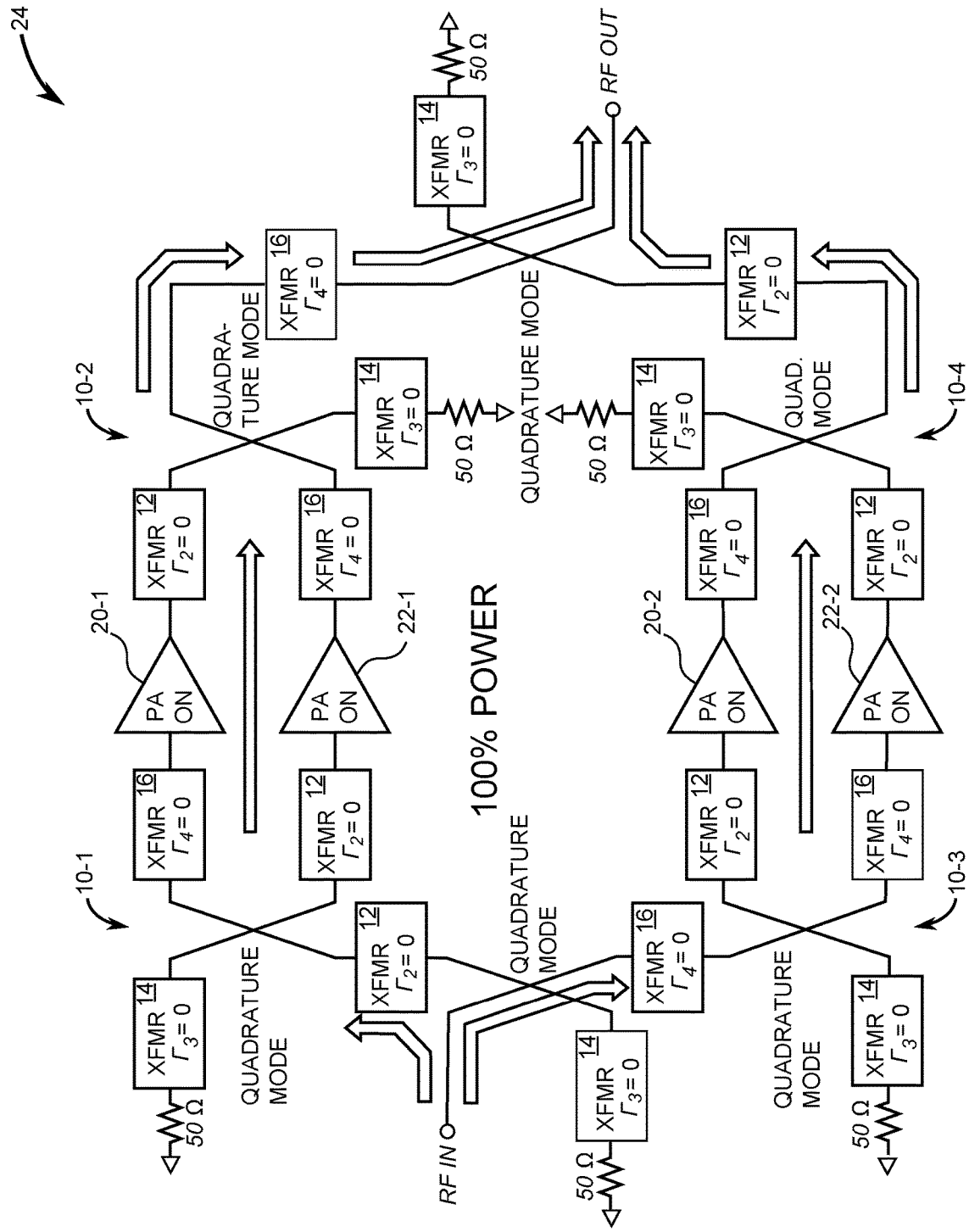
FIG. 3A is a schematic of an exemplary embodiment of a four-level power reconfigurable power amplifier configured for 100% power operation.
Figure 3B:
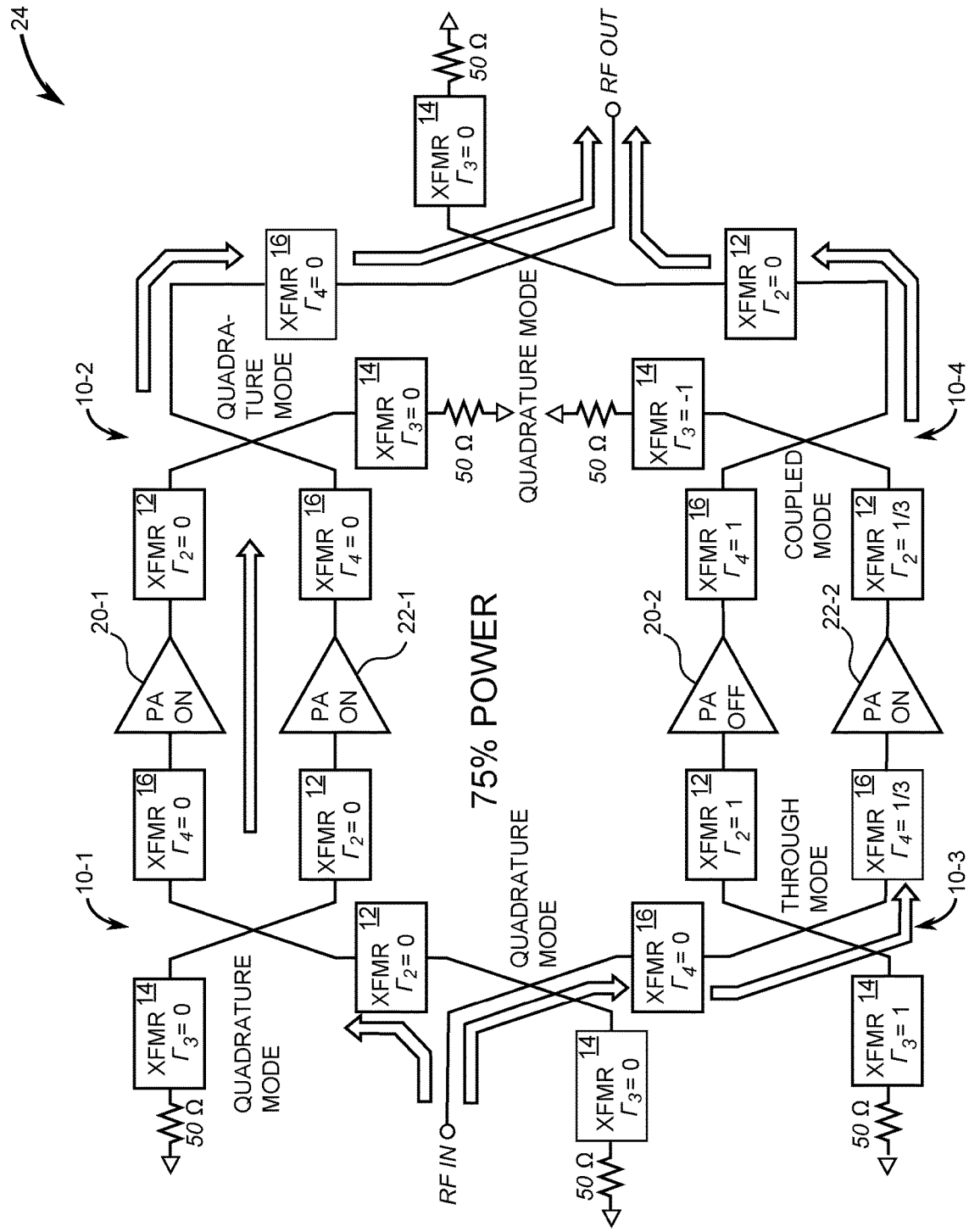
FIG. 3B is a schematic of an exemplary embodiment of the four-level power reconfigurable power amplifier configured for 75% power operation.

The quadrature phase relationship between the quadrature, coupled, and through modes is not relevant for the two-level examples shown in FIG. 2A and FIG. 2B. This is not the case for nesting additional pairs of quadrature couplers to generate four, eight, or more power level amplifiers. A four-level reconfigurable power amplifier 24 configured for maximum output power is shown in FIG. 3A. Like references to transformers 12, 14, and 16 represent like configurations. All of the couplers 10-1, 10-2, 10-3, and 10-4 are set to quadrature mode, and the reconfigurable power amplifier 24 operates as a conventional four-way balanced amplifier. By setting the couplers 10-3 and 10-4 as shown in FIG. 3B, the second upper constituent amplifier 20-2 is effectively turned off. After a corresponding adjustment of the RF input power, a 25% reduction in overall output power results with no change in gain or efficiency.

Figure 4A:
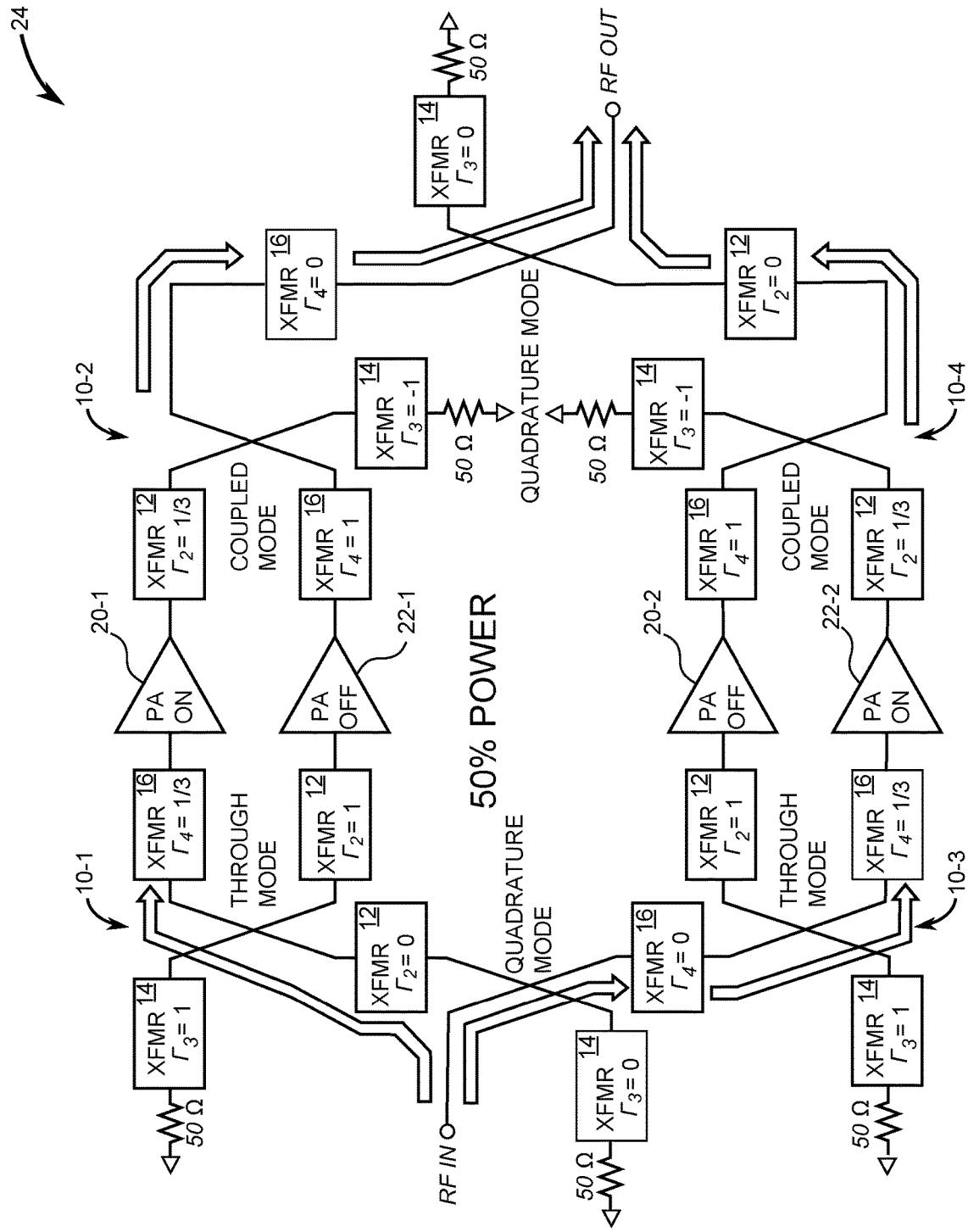
FIG. 4A is a schematic of an exemplary embodiment of the four-level power reconfigurable power amplifier configured for 50% power operation.
Figure 4B:
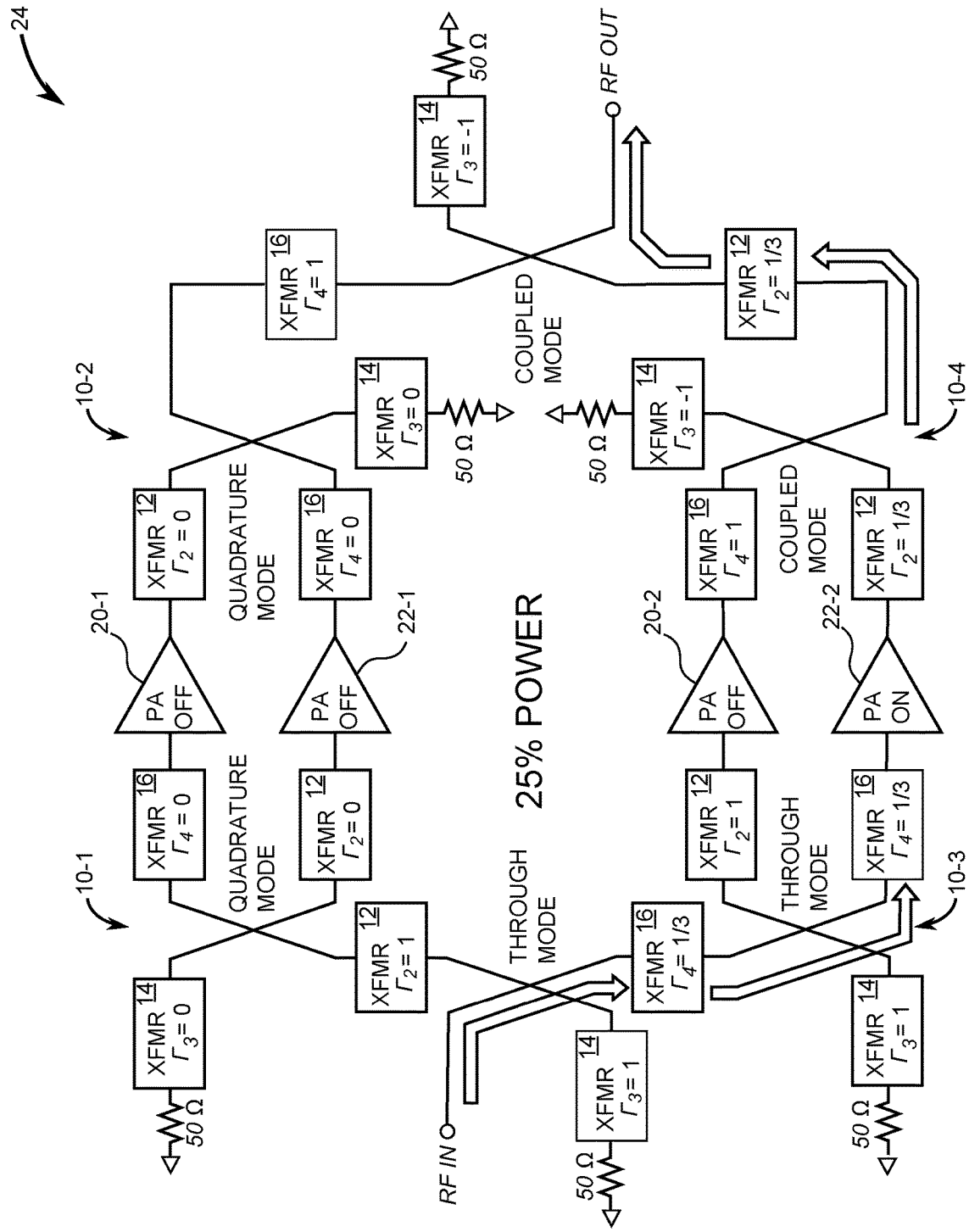
FIG. 4B is a schematic of an exemplary embodiment of the four-level power reconfigurable power amplifier configured for 25% power operation.

For the 75% output power mode shown in the FIG. 3B the quadrature through mode/coupled mode phase relationship is critical if the in-phase power combining is to occur at the output port of the reconfigurable power amplifier. The other two modes of operation, 50% power and 25% power, are shown in FIG. 4A and FIG. 4B, respectively.

Figure 5:
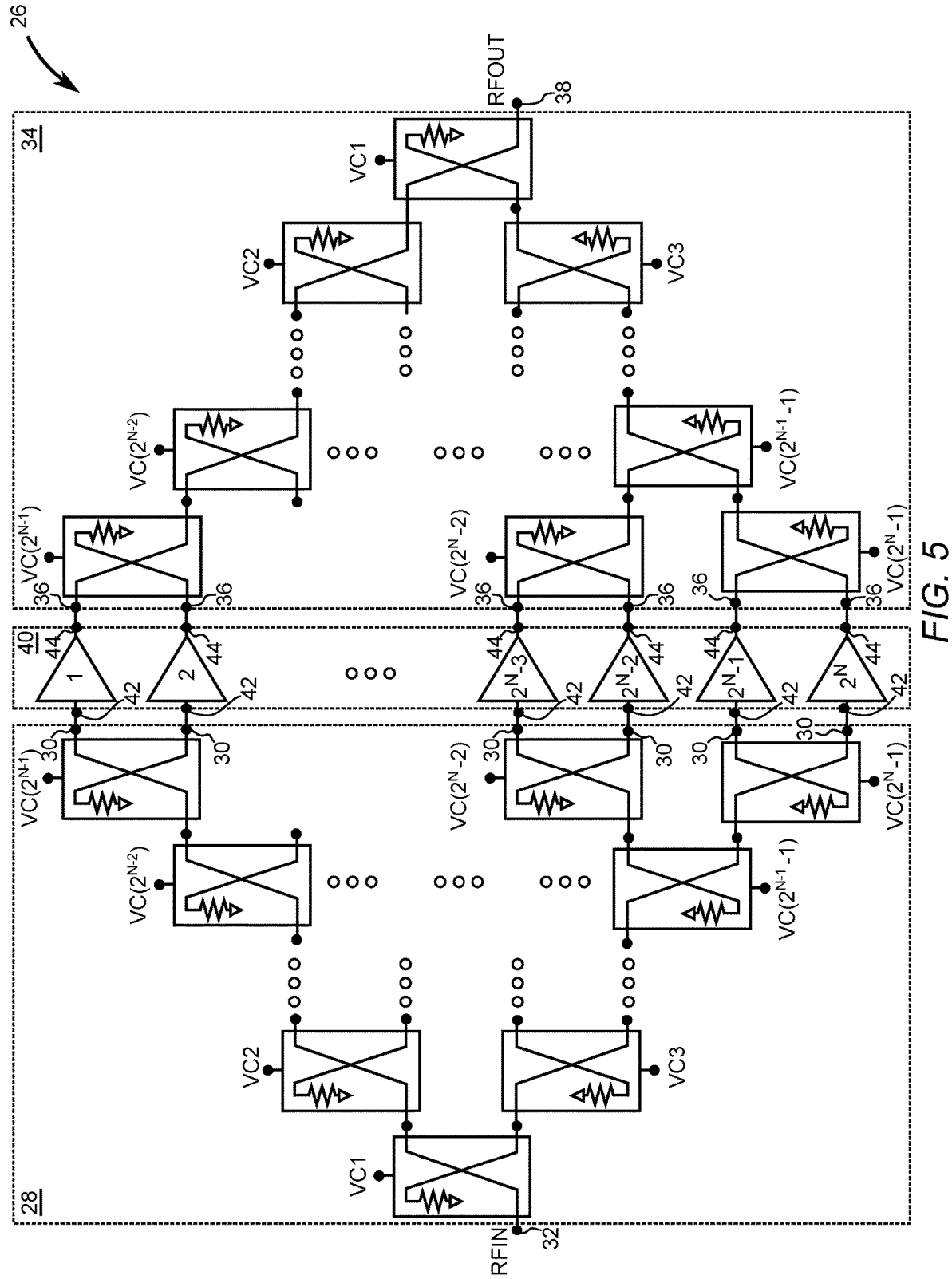
FIG. 5 is a schematic of an $2^N$-level power reconfigurable power amplifier that is structured in accordance with the present disclosure.

As demonstrated by the two- and four-level examples, this approach is scalable to higher numbers of levels at the expense of die size and some performance degradation due to loss from nesting additional couplers. An exemplary embodiment of a generalized $2^N$-level power reconfigurable power amplifier is shown in FIG. 5, which is a schematic of an $2^N$-level power reconfigurable power amplifier 26. The reconfigurable power amplifier 26 has a $2^N-1$ number of input-side reconfigurable quadrature couplers 28 connected in a tree structure, wherein a $2^{(N-1)}$ number of the input-side reconfigurable quadrature couplers 28 have coupler output terminals 30, and a root of the tree structure is one of the input-side reconfigurable quadrature couplers having a main input terminal 32. Further included is a $2^N-1$ number of output-side reconfigurable quadrature couplers 34 connected in a tree structure, wherein a $2^{(N-1)}$ number of the output-side reconfigurable quadrature couplers have coupler input terminals 36, and a root of the tree structure is one of the output-side reconfigurable quadrature couplers having a main output terminal 38. The reconfigurable power amplifier 26 also includes an $2^N$ number of constituent amplifiers 40 divided into amplifier pairs having amplifier input terminals 42 connected to corresponding ones of the coupler output terminals 30 and having amplifier output terminals 44 coupled to corresponding ones of the coupler input terminals 36, wherein N is a natural counting number. Moreover, N is defined as the order of the nesting of either the input-side reconfigurable quadrature couplers 28 or the output-side reconfigurable quadrature couplers 34. The number of realizable power levels is $2^N$ and a total range in decibels is 3.01 N.

Figure 6A:
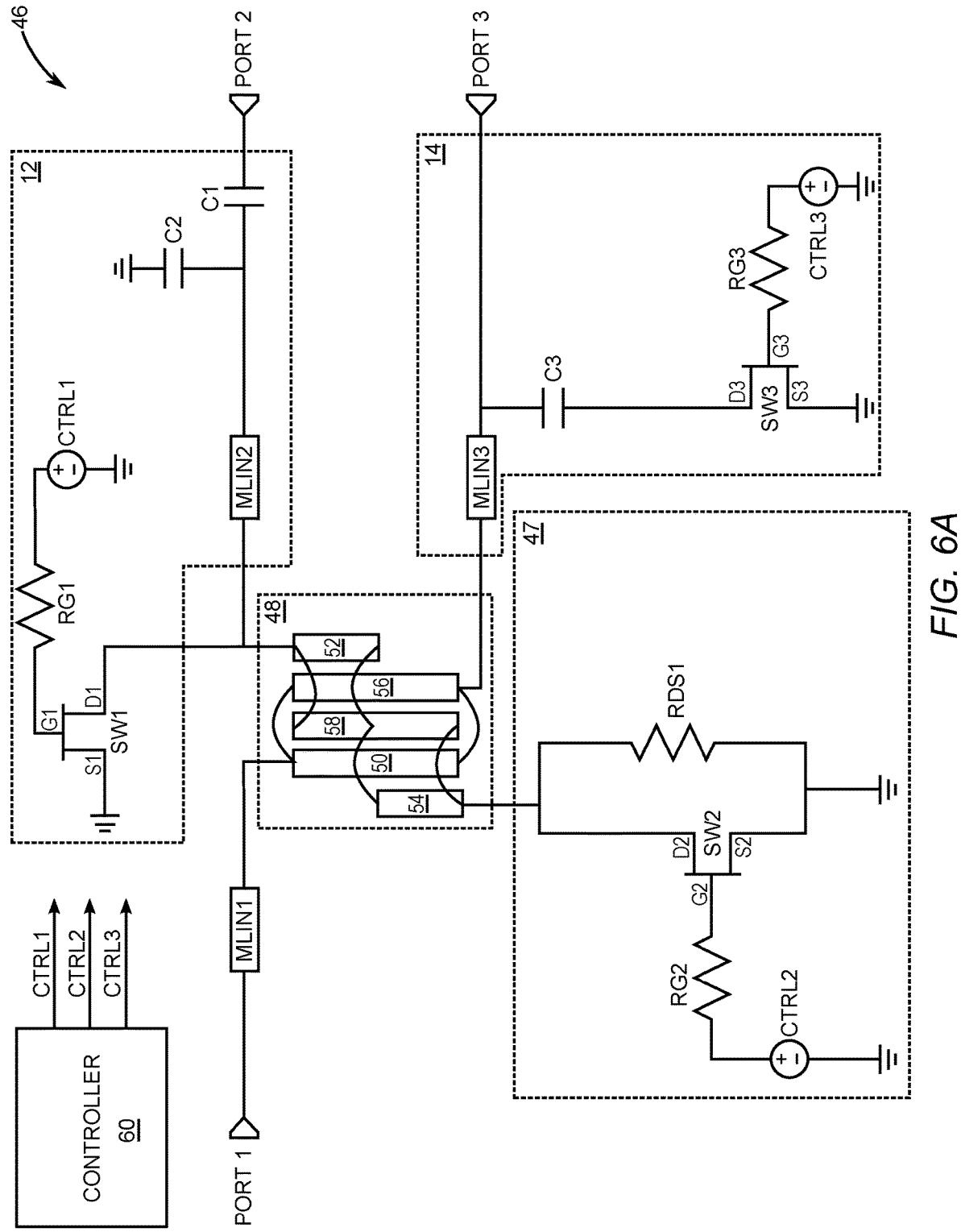
FIG. 6A is a schematic of a reconfigurable input coupler that is structured in accordance with the present disclosure.

Inspecting the required coupler reconfigurations for the two-level and four-level examples shown in FIGS. 2A to 4B, it is clear that any given coupler will only have to operate in two of three possible modes. In FIG. 2A and FIG. 2B N=1, and in FIGS. 3A through 4B N=2. For these examples, the input-side couplers operate in quadrature and through mode while the output-side couplers operate in quadrature and coupled mode. Two-mode operation allows the input and output couplers to be individually optimized for best performance as long as the quadrature phase relationship between the modes is preserved. Embodiments of the input and output couplers for a power reconfigurable power amplifier are shown in FIG. 6A, which is a schematic of a reconfigurable input coupler 46, and in FIG. 6B, which is a schematic of a reconfigurable output coupler 62. The reconfigurable input coupler 46 and the reconfigurable output coupler 62 are configured to operate over a frequency band consistent with satellite downlink applications, 19 GHz to 23 GHz.

FIG. 6A is a schematic of a reconfigurable input coupler 46 that is structured in accordance with the present disclosure. This exemplary embodiment includes a Lange coupler structure 48 that has a first transmission line 50 connected to the first port (PORT 1), and a second transmission line 52 with the second port transformer 12 connected between the second transmission line 52 and the second port (PORT 2). The Lange coupler structure 48 also includes a third transmission line 54 with a selectable termination transformer 47 connected between the third transmission line 54 and ground. The Lange coupler structure 48 further includes a fourth transmission line 56 with the third port transformer 14 connected between the fourth transmission line 56 and the third port (PORT 3). The Lange coupler structure 48 further includes a central transmission line 58 that is connected to the second transmission line 52 and the third transmission line 54.

In this exemplary embodiment, a first microstrip line MLIN1 is connected between PORT 1 and the first transmission line 50. Also, as depicted in FIG. 6A, an exemplary embodiment of the second port transformer 12 includes a second microstrip line MLIN2 and a first capacitor C1 that are connected in series between the second transmission line 52 and PORT 2. A second capacitor C2 is coupled between ground and a node between the second microstrip line MLIN2 and PORT2.

To make the value of the reflection coefficient $\Gamma_2$ for PORT 2 selectable, the second port transformer 12 is made reconfigurable by way of a first switched impedance branch that is connected to ground through a first transistor switch SW1. A source S1 of the first transistor switch SW1 is coupled to ground, and a gate G1 of the first switch SW1 is connected to a first control line CTRL1 that is connected to a controller 60 through a first gate resistor RG1. When the controller 60 turns on the first transistor switch SW1, the first switched branch is active and the value of the reflection coefficient $\Gamma_2$ is different from when the controller 60 turns off the first transistor switch SW1.

Moreover, as depicted in FIG. 6A, the selectable termination transformer 47 includes a second transistor switch SW2 connected between the third transmission line 54 and ground. A drain D2 of the second transistor switch SW2 is connected to the third transmission line 54, and a source S2 is coupled to ground. A drain-to-source resistor RDS1 is connected between the drain D2 and the source S2. A gate resistor RG2 is connected between a second control line CTRL2 of the controller 60 and the gate G2 of the second transistor switch SW2. When the controller 60 turns on the second switch SW2, the value of a termination reflection coefficient is different from when the controller 60 turns off the second transistor switch SW2.

Further still, as depicted in FIG. 6A, an exemplary embodiment of the third port transformer 14 includes a third microstrip line MLIN3 connected between the fourth transmission line 56 and PORT 3. In order to make the value of the reflection coefficient $\Gamma_3$ for PORT 3 selectable, the third port transformer 14 is made reconfigurable by way of a third switched impedance branch that is connected to ground through a third transistor switch SW3. The third switched impedance branch has a third capacitor C3 connected in between a drain D3 of the third transistor switch SW3 and a node between the third microstrip line MLIN3 and PORT3. A source S3 of the third transistor switch SW3 is coupled to ground, and a gate G3 of the third transistor SW3 is connected to a third gate resistor RG3. A third control line CTRL3 is connected between the controller 60 and the third gate resistor RG3. When the controller 60 turns on the third switch SW3, the third switched branch is active and the value of the reflection coefficient $\Gamma_3$ is different from when the controller 60 turns off the third transistor switch SW3. While the embodiment of FIG. 6A shows the three control lines CTRL1, CTRL2, and CTRL3, it is to be understood that the three control lines may be replaced by a single control line that controls the three switches SW1, SW2, and SW3.

All of the circuit elements such as microstrip lines MLIN1 through MLIN3 and capacitors C1 through C3 may or may not be required depending on application, frequency, bandwidth, and actual terminating impedances. To further investigate, reconfigurable impedance transforming circuits were designed using the topology shown in FIG. 6A as the starting point. The investigated versions of the reconfigurable quadrature coupler 10 depicted in FIG. 6A were optimized over a frequency range consistent with satellite downlink applications, 19 GHz to 23 GHz.

Figure 6B:
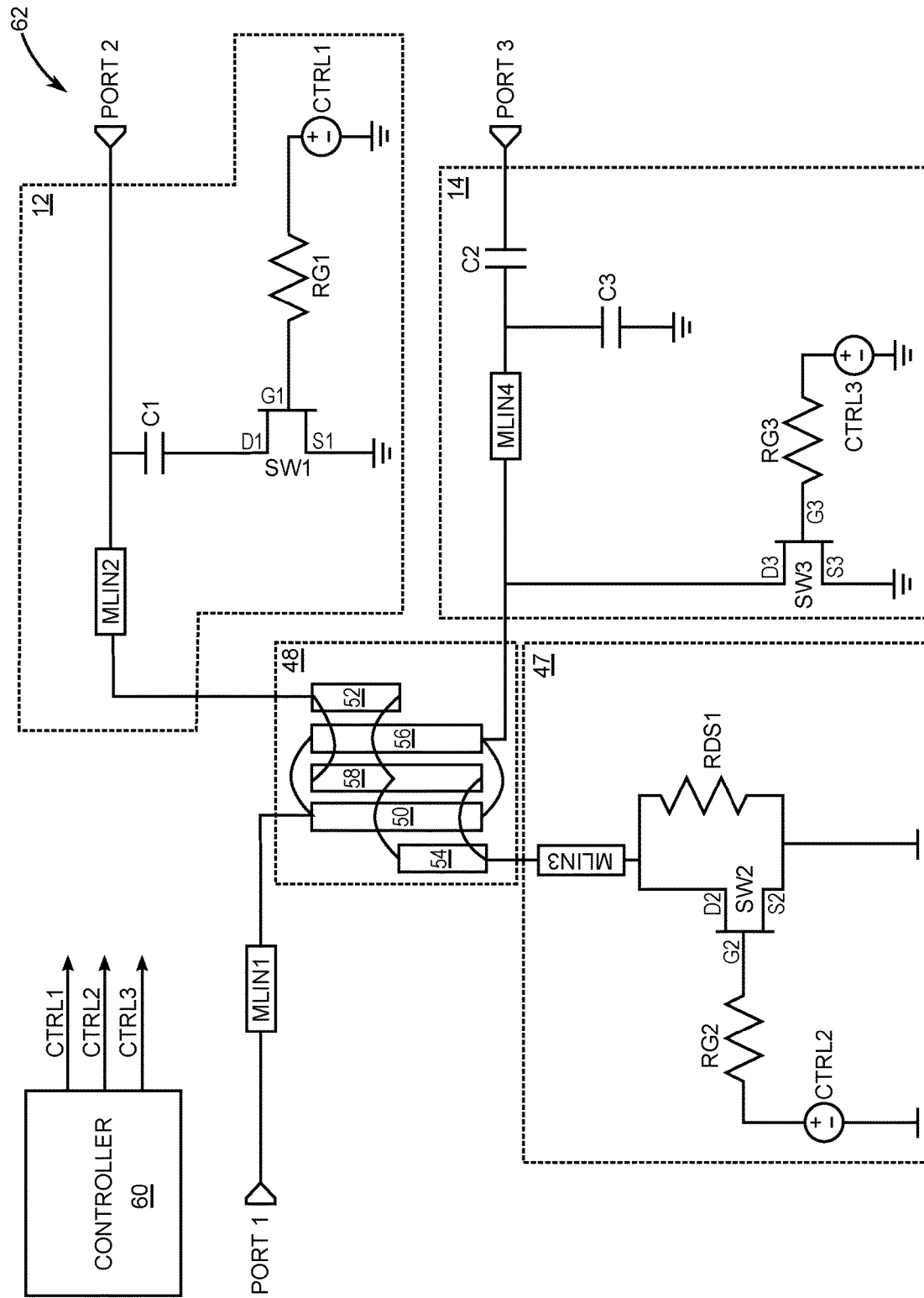
FIG. 6B is a schematic of a reconfigurable output coupler that is structured in accordance with the present disclosure.

FIG. 6B is a schematic of a reconfigurable output coupler 62 that is structured in accordance with the present disclosure. This exemplary embodiment includes the Lange coupler structure 48.

In this exemplary embodiment, in an exemplary embodiment of the second port transformer 12, the second microstrip line MLIN2 is connected between the second transmission line 52 and PORT 2. The first capacitor C1 is connected between the drain D1 and the node between the second microstrip line MLIN2 and PORT2.

To make the value of the reflection coefficient $F_2$ for PORT 2 selectable, the second port transformer 12 is made reconfigurable by way of the first transistor switch SW1. The source S1 of the first transistor switch SW1 is coupled to ground, and the gate G1 of the first switch SW1 is connected through the first gate resistor RG1 to the first control line CTRL1. When the controller 60 turns on the first transistor switch SW1, the first switched branch is active and the value of the reflection coefficient $\Gamma_2$ is different from when the controller 60 turns off the first transistor switch SW1.

Moreover, as depicted in FIG. 6B, in an exemplary embodiment of the selectable termination transformer 47 the drain D2 of the second transistor switch SW2 is connected to the third transmission line 54 through the third microstrip line MLIN3. The source S2 may be coupled directly to ground as shown in FIG. 6B. When the controller 60 turns on the second switch SW2, the value of the termination reflection coefficient is different from when the controller 60 turns off the second transistor switch SW2.

Further still, as depicted in FIG. 6B, an exemplary embodiment of the third port transformer 14 includes a fourth microstrip line MLIN4 and the second capacitor C2 connected series between the fourth transmission line 56 and PORT 3. In order to make the value of the reflection coefficient $\Gamma_3$ for PORT 3 selectable, the third port transformer 14 is made reconfigurable by way of the third transistor switch SW3. In this case the drain D3 is connected directly to fourth transmission line 56. When the controller 60 turns on the third switch SW3, the value of the reflection coefficient $\Gamma_3$ is different from when the controller 60 turns off the third transistor switch SW3. While the embodiment of FIG. 6B shows the three control lines CTRL1, CTRL2, and CTRL3, it is to be understood that the three control lines may be replaced by a single control line that controls the three switches SW1, SW2, and SW3.

All of the circuit elements such as microstrip lines MLIN1 through MLIN4 and capacitors C1 through C3 may or may not be required depending on application, frequency, bandwidth, and actual terminating impedances. To further investigate, reconfigurable impedance transforming circuits were designed using the topology shown in FIG. 6B as the starting point. The investigated versions of the reconfigurable quadrature coupler 10 depicted in FIG. 6B were optimized over a frequency range consistent with satellite downlink applications, 19 GHz to 23 GHz.

Figure 7A:
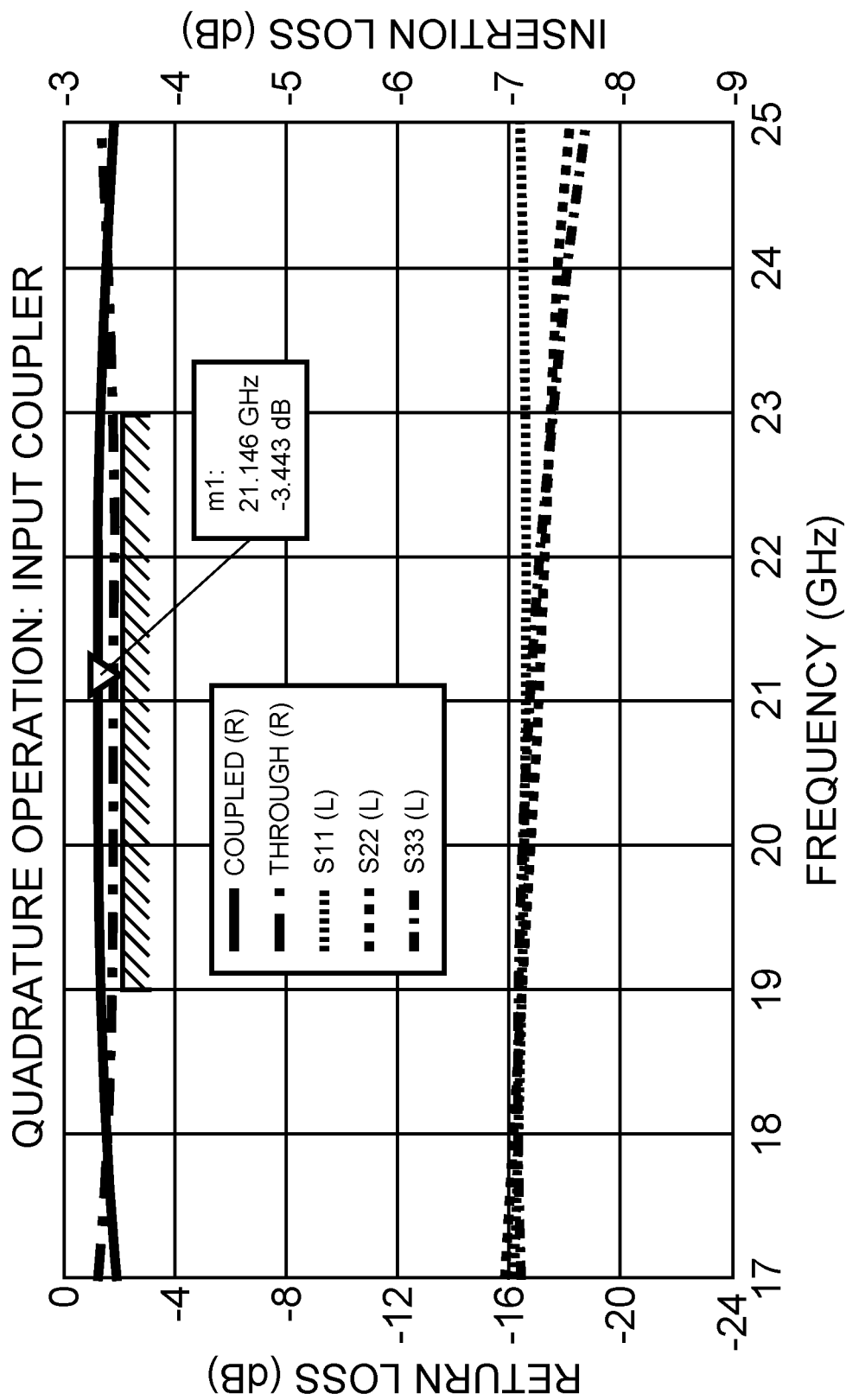
FIG. 7A is a plot of simulation results for quadrature mode operation of the reconfigurable input coupler of FIG. 6A.
Figure 7B:
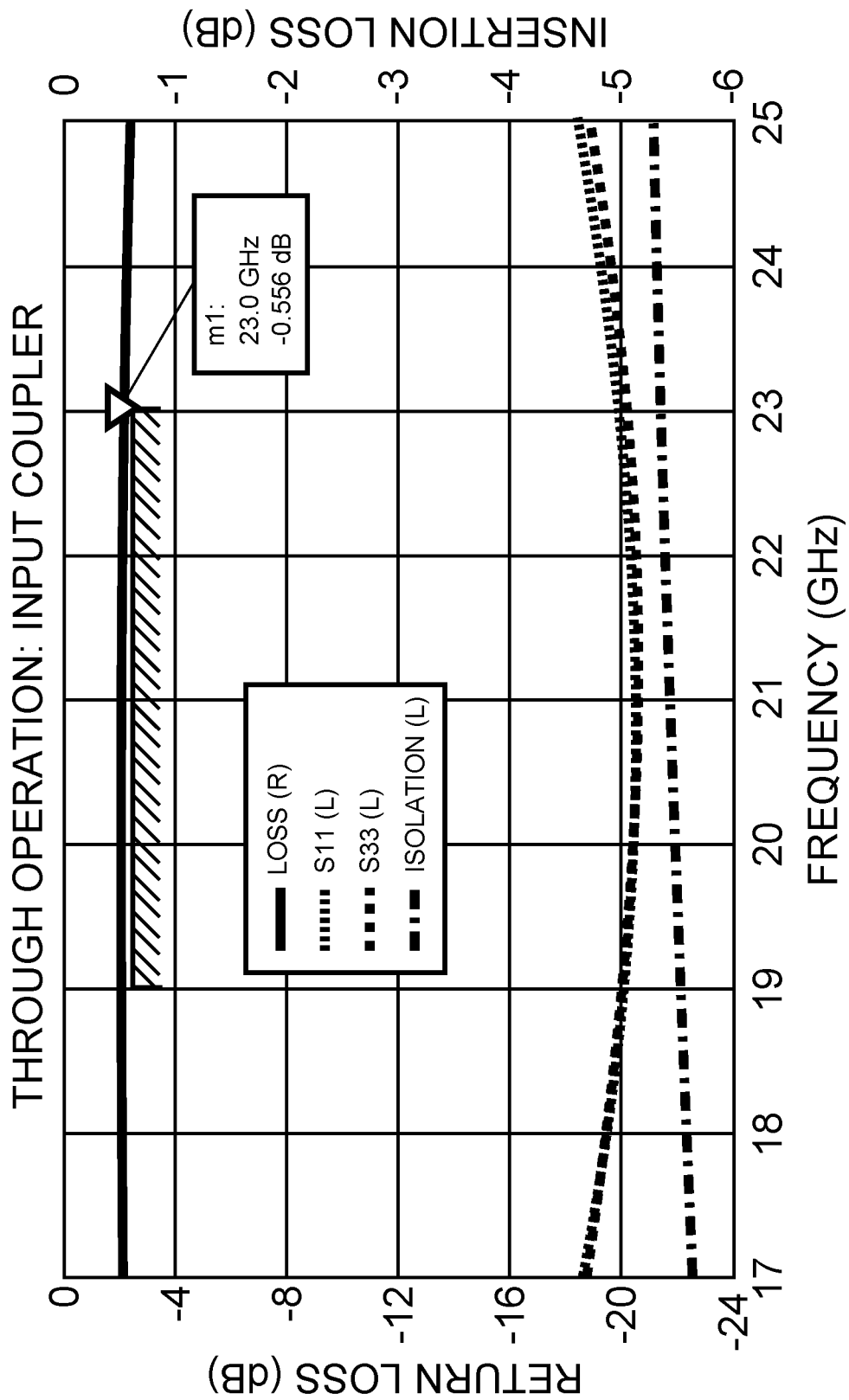
FIG. 7B is a plot of simulation results for through mode operation of the reconfigurable input coupler of FIG. 6A.
Figure 8A:
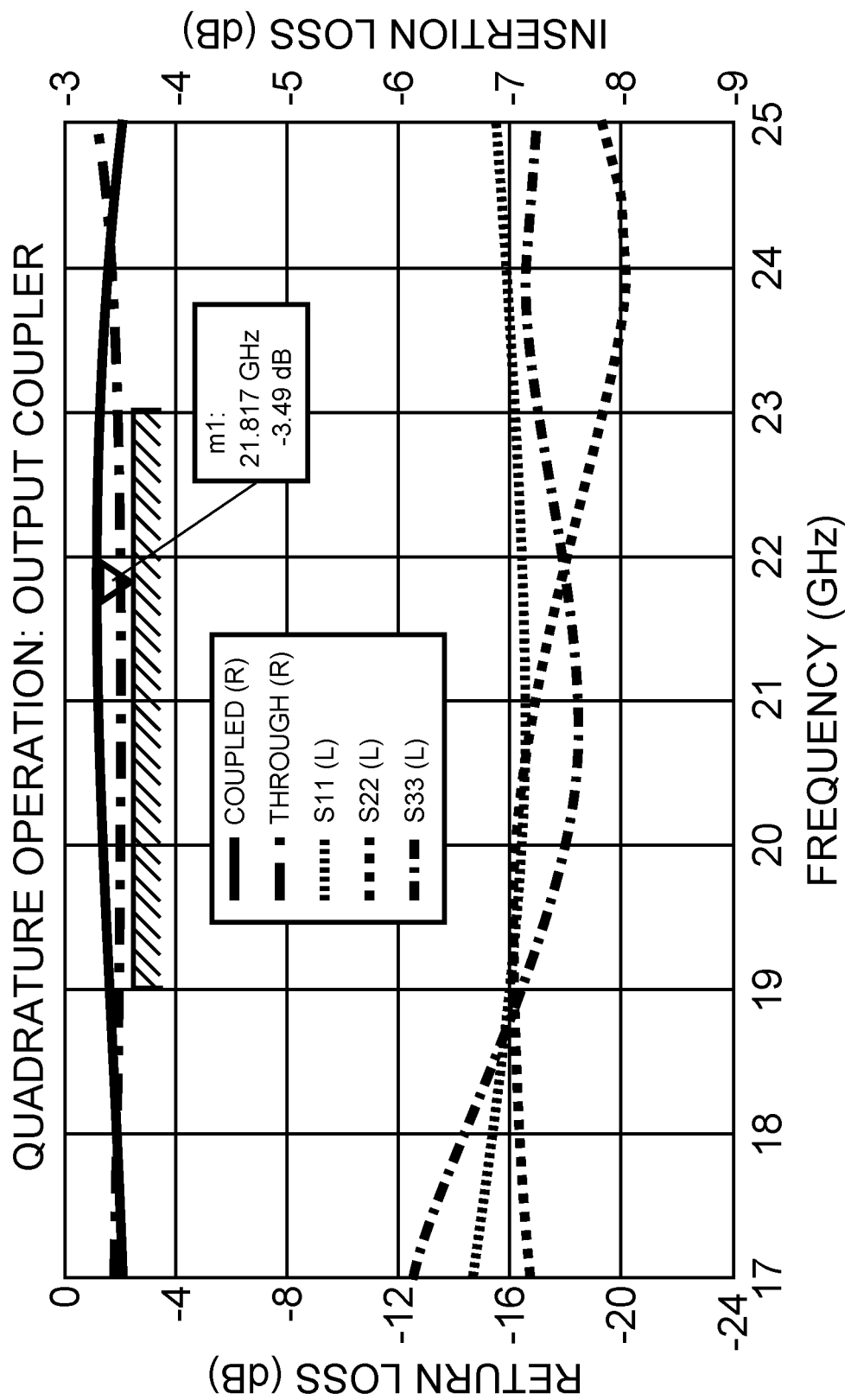
FIG. 8A is a plot of simulation results for quadrature mode operation of the reconfigurable output coupler of FIG. 6B.
Figure 8B:
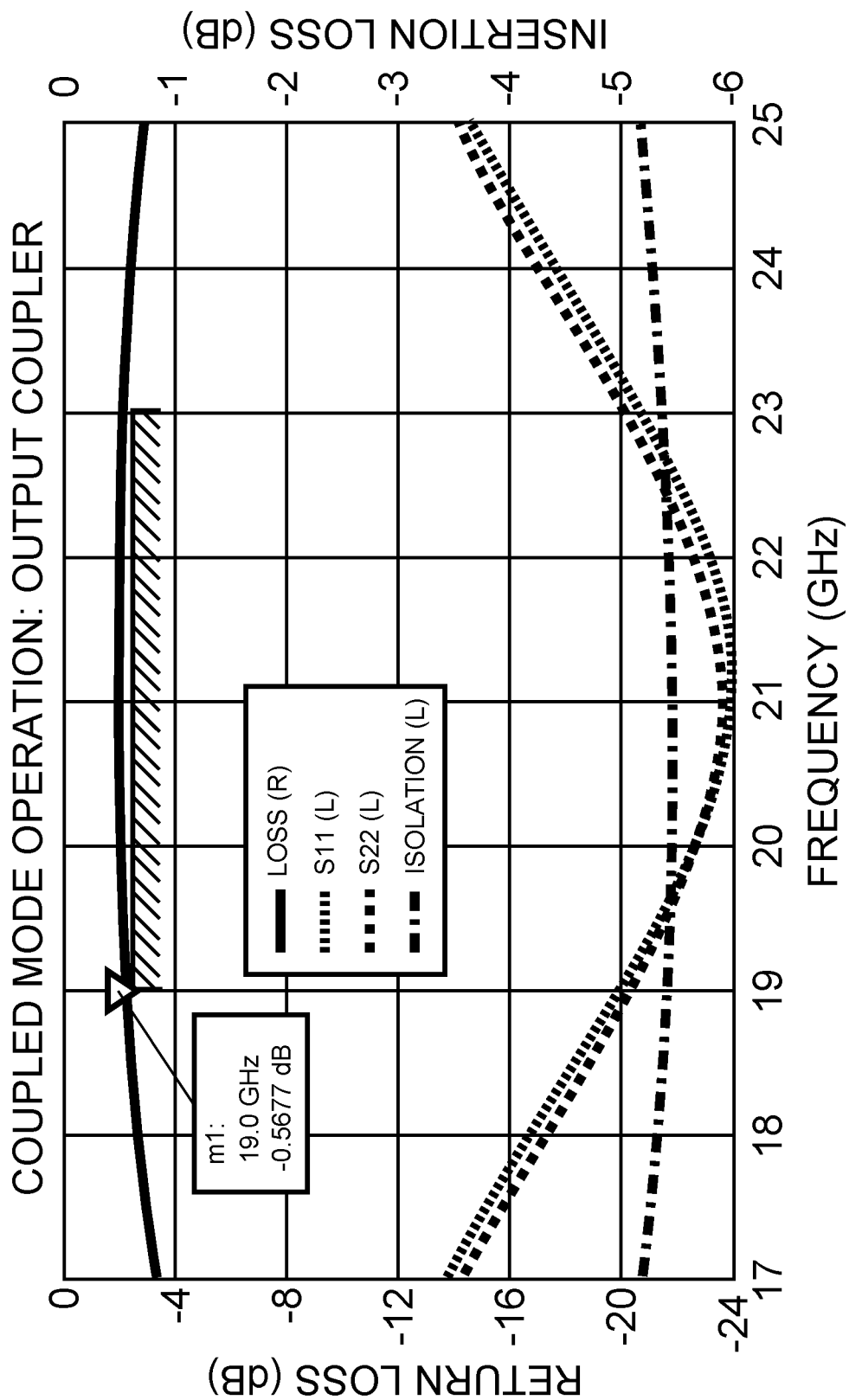
FIG. 8B is a plot of simulation results for coupled mode operation of the reconfigurable output coupler of FIG. 6B.
Figure 9A:
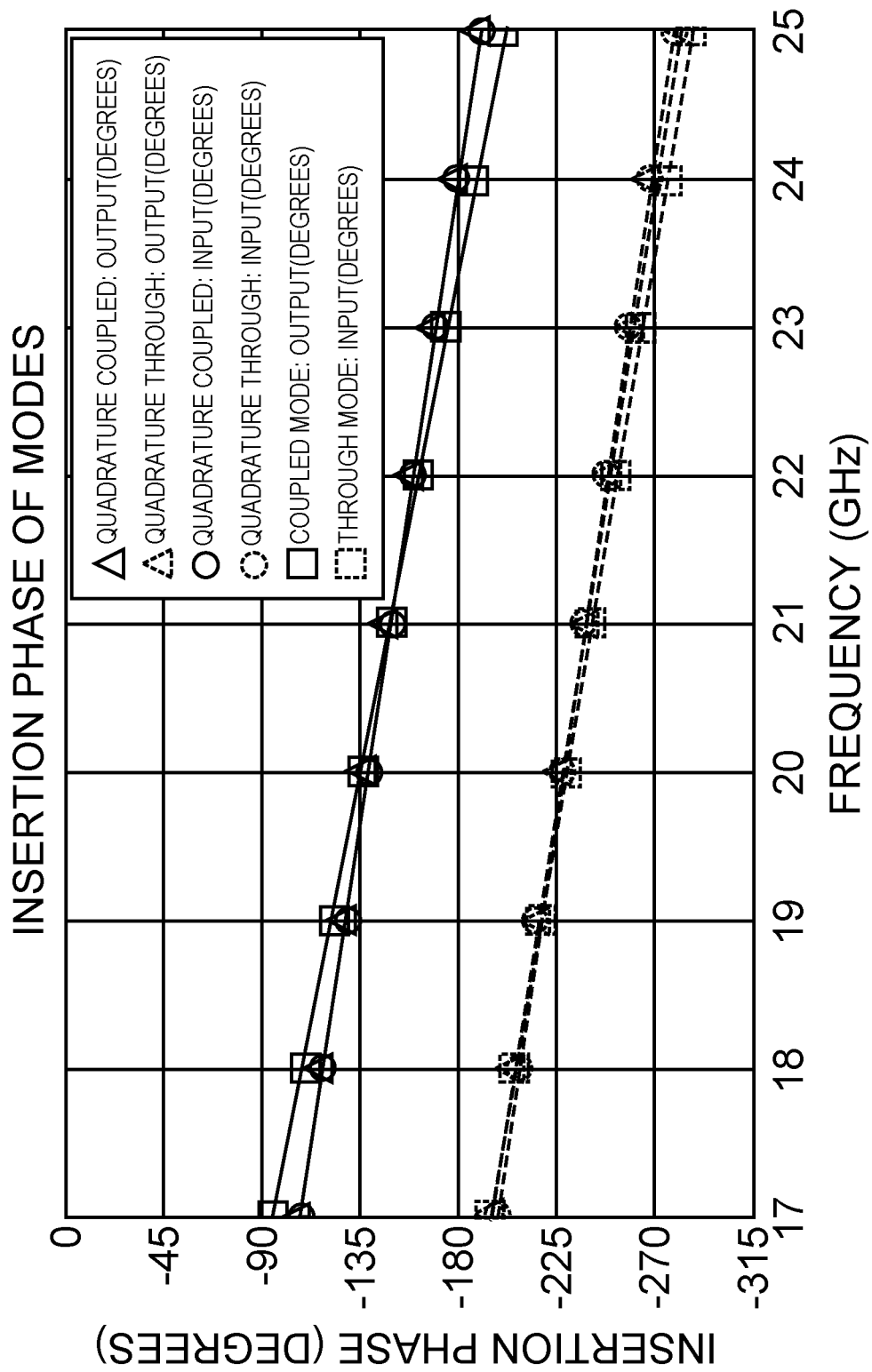
FIG. 9A is a plot of simulation results of insertion phase for the quadrature, coupled, and through modes.
Figure 9B:
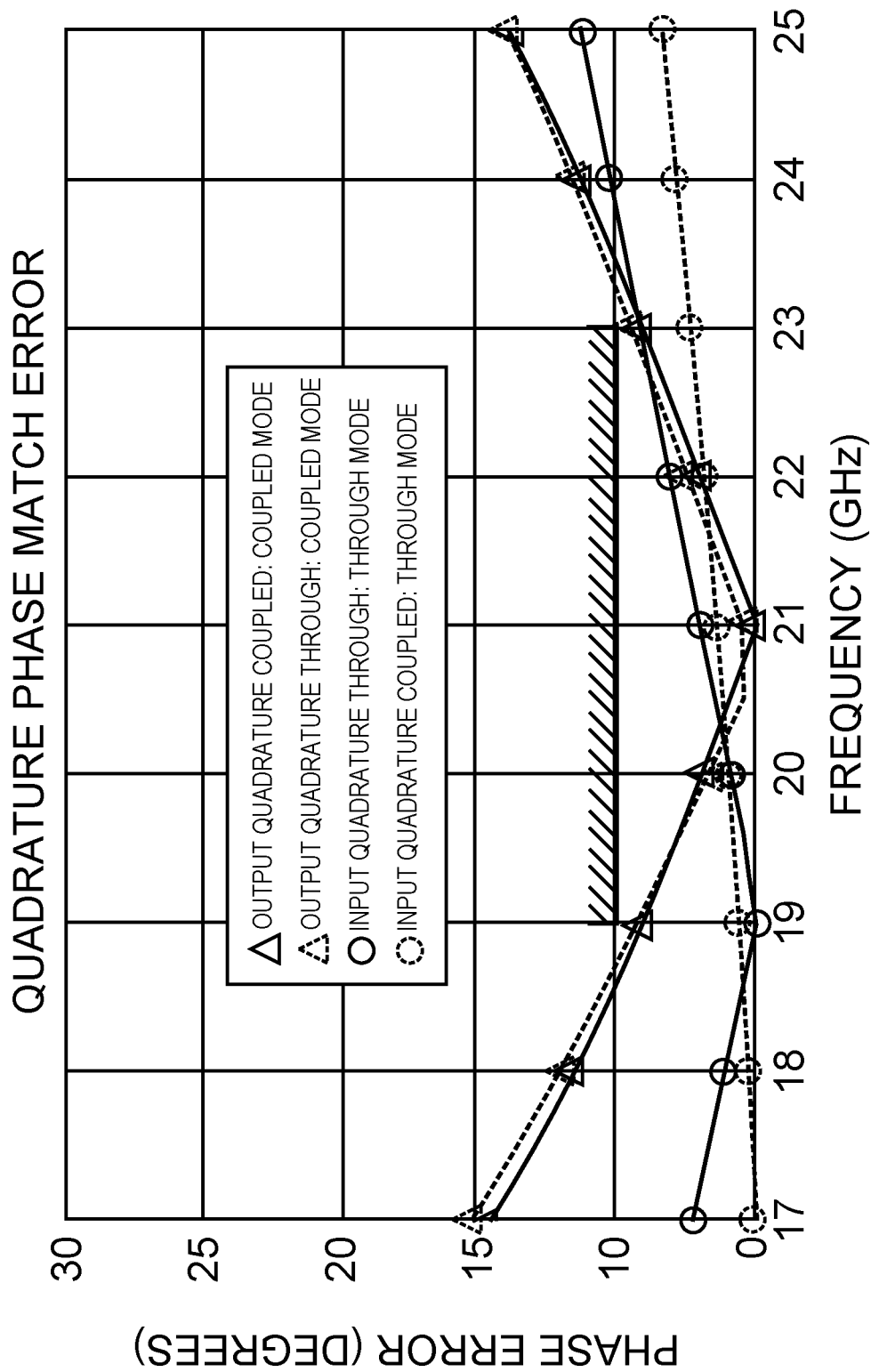
FIG. 9B is a plot of simulation results of quadrature phase imbalance for the quadrature, coupled, and through modes.

Simulated performances for input couplers and the output couplers are plotted graphically. FIG. 7A is a plot of simulation results for quadrature mode operation of the reconfigurable input coupler of FIG. 6A. FIG. 7B is a plot of simulation results for through mode operation of the reconfigurable input coupler of FIG. 6A. FIG. 8A is a plot of simulation results for quadrature mode operation of the reconfigurable output coupler of FIG. 6B. FIG. 8B is a plot of simulation results for coupled mode operation of the reconfigurable output coupler of FIG. 6B. FIG. 9A is a plot of simulation results of insertion phase for the quadrature, coupled, and through modes. FIG. 9B is a plot of simulation results of quadrature phase imbalance for the quadrature, coupled, and through modes. For the through and coupled modes the insertion loss is less than 0.6 dB over the 19 GHz to 23 GHz design band. For the balanced mode of operation the insertion loss is estimated to be less than 0.4 dB. The phase error from quadrature for the through and coupled modes referenced to the corresponding balanced mode is typically less than 6°. This amount of phase error results in a near negligible 0.025 dB of combining loss.

Figure 10:
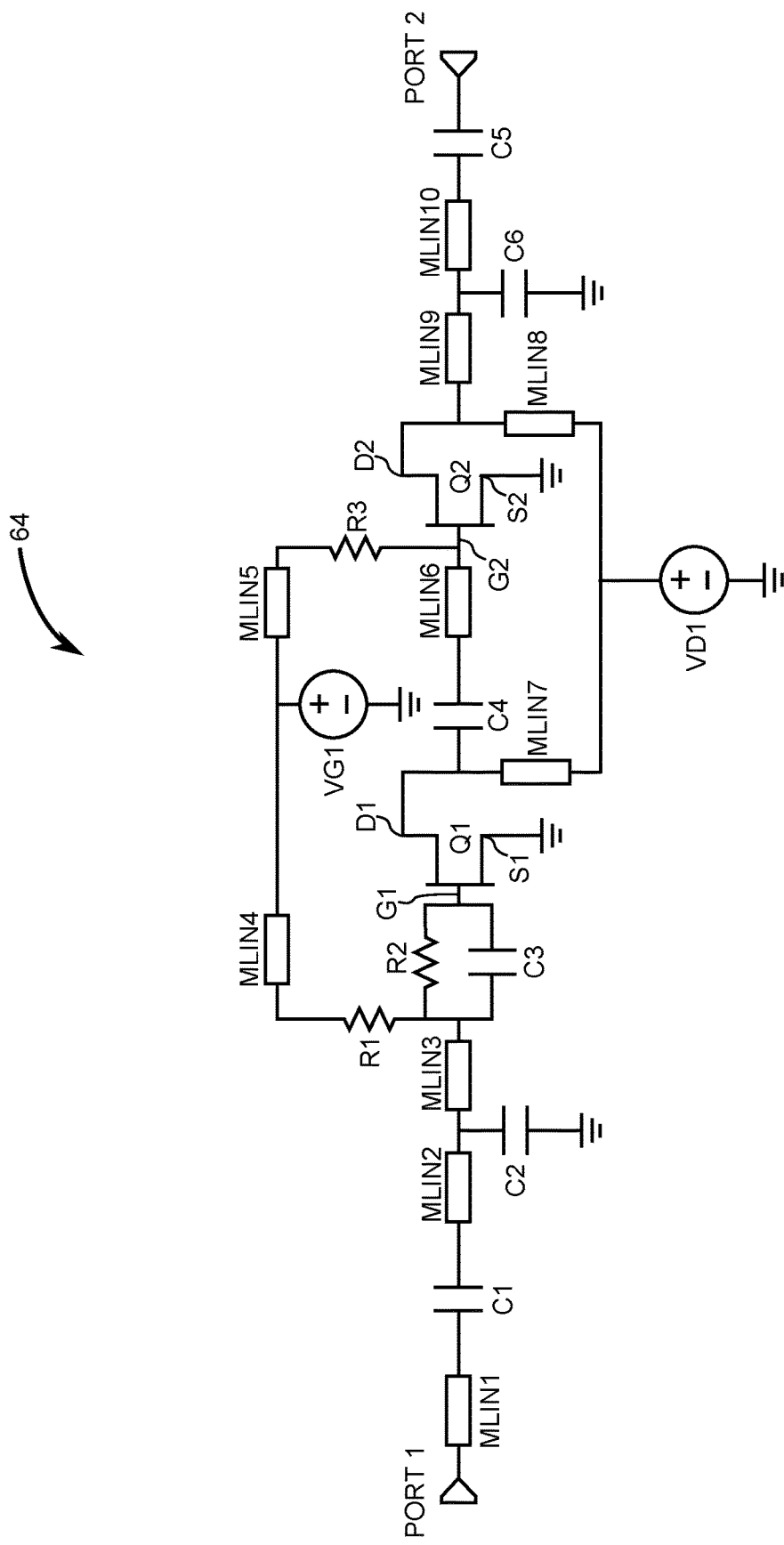
FIG. 10 is a schematic of a notional two-stage 19 GHz to 23 GHz constituent power amplifier that is structured in accordance with the present disclosure.

A next step is to use these coupler designs a with realistic nonlinear power amplifier circuit model to construct a power reconfigurable power amplifier. For demonstration, a notional two-stage 19 GHz to 23 GHz constituent power amplifier was used, as shown in FIG. 10. FIG. 10 is a schematic of a notional two-stage 19 GHz to 23 GHz constituent power amplifier 64 that is structured in accordance with the present disclosure. The constituent power amplifier 64 includes a first transistor Q1 that is configured to drive a second transistor Q2. A first microstrip line MLIN1 is connected in series with a first capacitor C1 between PORT 1 and a second microstrip line MLIN2. A third microstrip line MLIN3 is coupled between the second microstrip line MLIN2 and a first resistor R1. A second capacitor is coupled to ground between a node between the second microstrip line MLIN2 and the third microstrip line MLIN3. A second resistor R2 is coupled between the first resistor, the third microstrip MLIN3, and a gate G1 of the first transistor Q1. A third capacitor is coupled in parallel with the second resistor R2.

A fourth microstrip line MLIN4 is coupled between the first resistor R1 and a fifth microstrip line MLIN5. A third resistor R3 is coupled between the fifth micro strip line MLIN5 and a gate G2 of the second transistor Q2. A gate voltage source VG1 is connected between ground and a node between the fourth microstrip line MLIN4 and the fifth microstrip line MLIN5.

A source S1 of the first transistor Q1 is connected to ground. A fourth capacitor C4 is connected in series with a sixth microstrip line MLIN6 between the drain D1 of the first transistor Q1 and the gate G2 if the second transistor Q2. A seventh microstrip line MLIN7 and an eight microstrip line MLIN8 are coupled between the drain D1 of the first transistor Q1 and the drain D2 of the second transistor Q2. A drain voltage source VD1 is coupled between ground and a node between the seventh microstrip line MLIN7 and the eight microstrip line MLIN8. A ninth microstrip line MLIN9, a tenth microstrip line MLIN10, and a fifth capacitor C5 are coupled in series between the drain D2 of the second transistor Q2 and PORT2. A sixth capacitor C6 is coupled between ground and a node between the ninth microstrip MLIN9 and the tenth microstrip MLIN10. A source S2 of the second transistor Q2 is connected to ground.

Figure 11A:
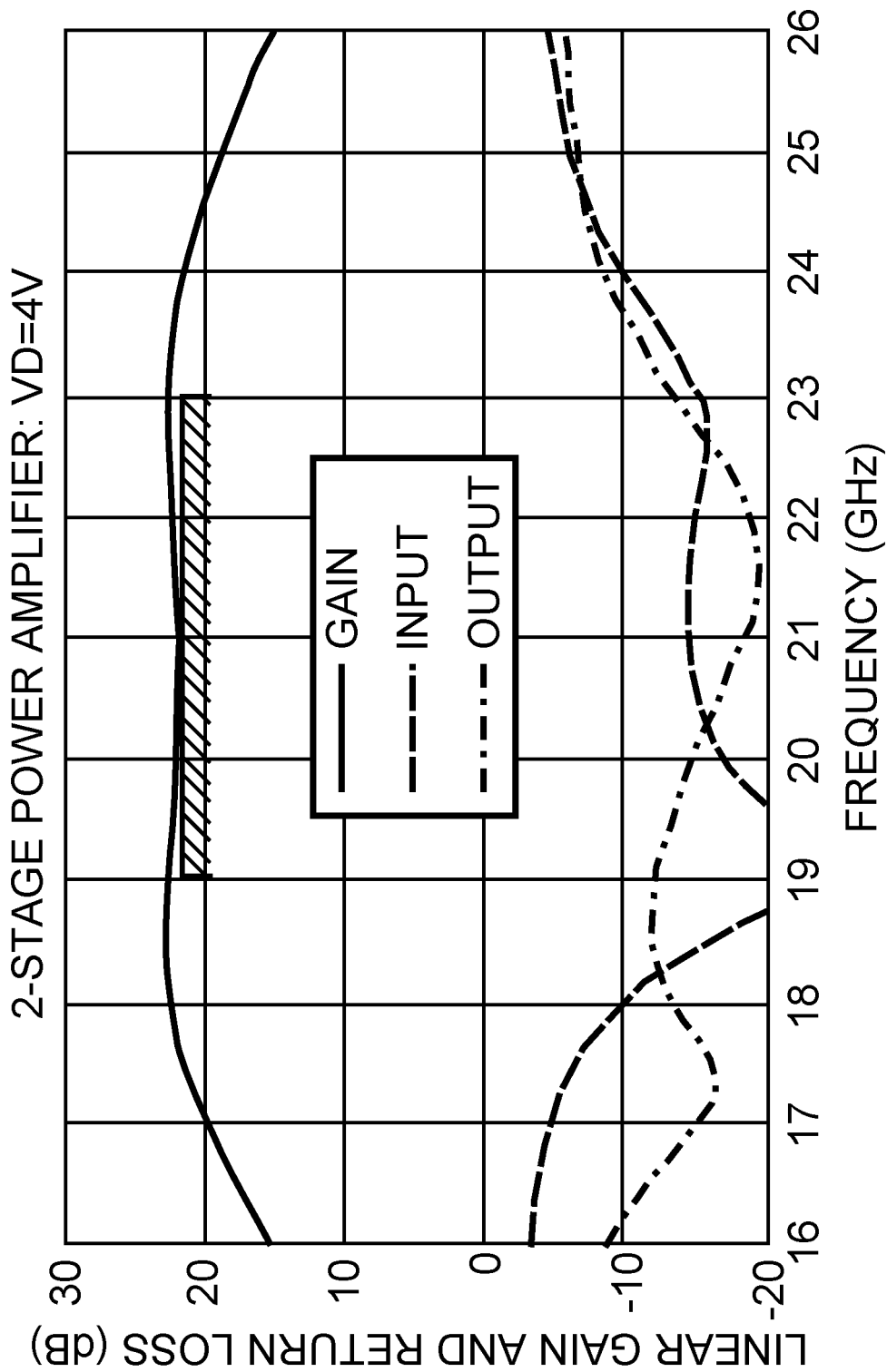
FIG. 11A is a plot of small signal results for the constituent power amplifier of FIG. 10.
Figure 11B:
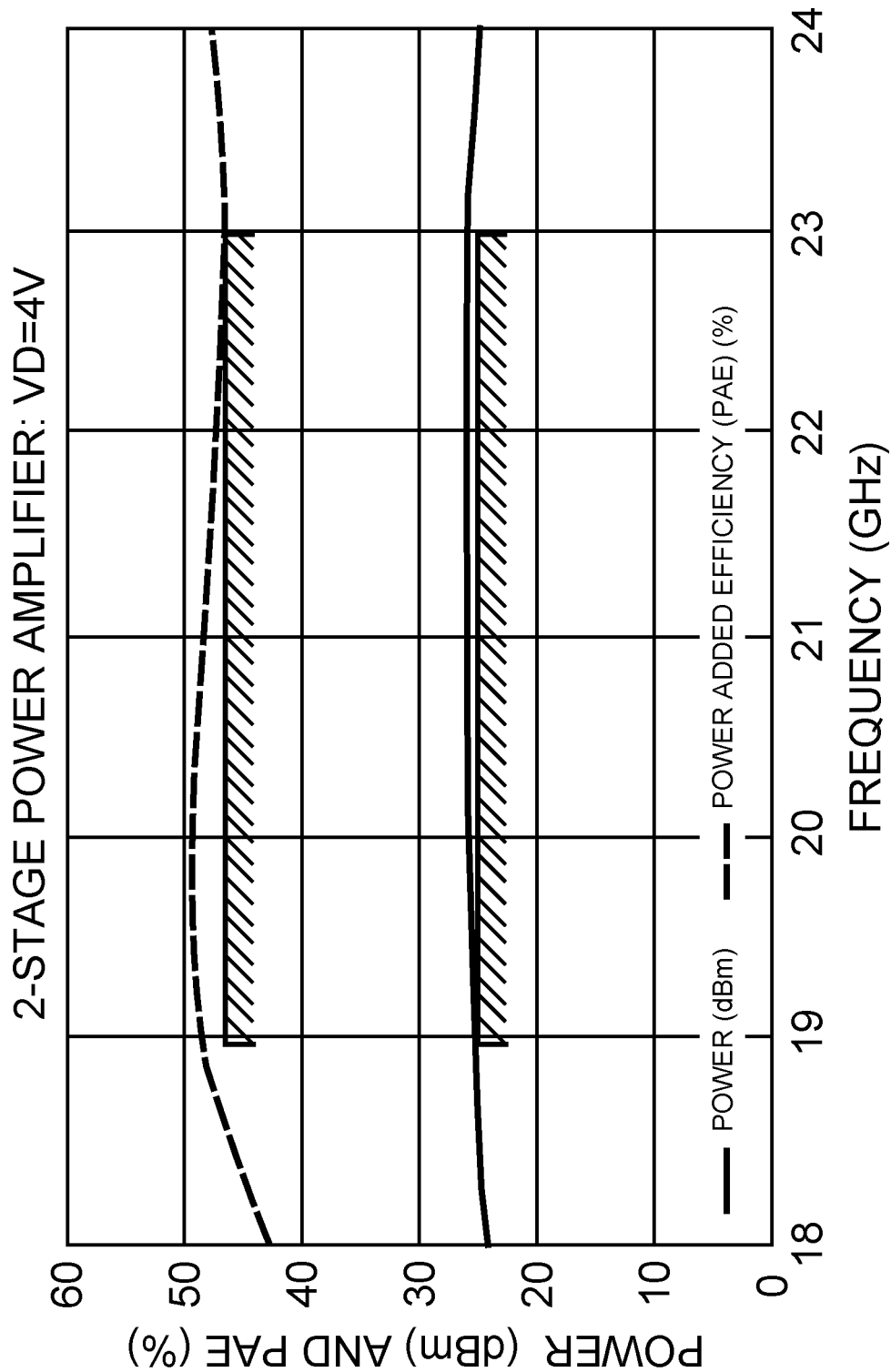
FIG. 11B is a plot of large signal results for the constituent power amplifier of FIG. 10.

Four of the constituent power amplifiers 64 are used in the four-level reconfigurable power amplifier. The constituent power amplifier was optimized for flat gain, flat output power, and high power-added efficiency (PAE) over the same 19 GHz to 23 GHz frequency band for which reconfigurable couplers were designed. The output power design goal when operated at 4 VVD is greater than 25 dBm, which should produce a four-level power reconfigurable power amplifier with at least 1 W of output power. Simulated results for the constituent power amplifier are plotted in FIG. 11A and FIG. 11B. Greater than 22 dB of reasonably flat gain and better than 12 dB return loss is predicted over the design band. Large signal simulations project the PAE to be greater than 47% with an associated minimum output power of 25 dBm. Given the simulated loss of the reconfigurable couplers, one would expect 37% to 39% PAE for a four-level reconfigurable design.

Figure 12A:
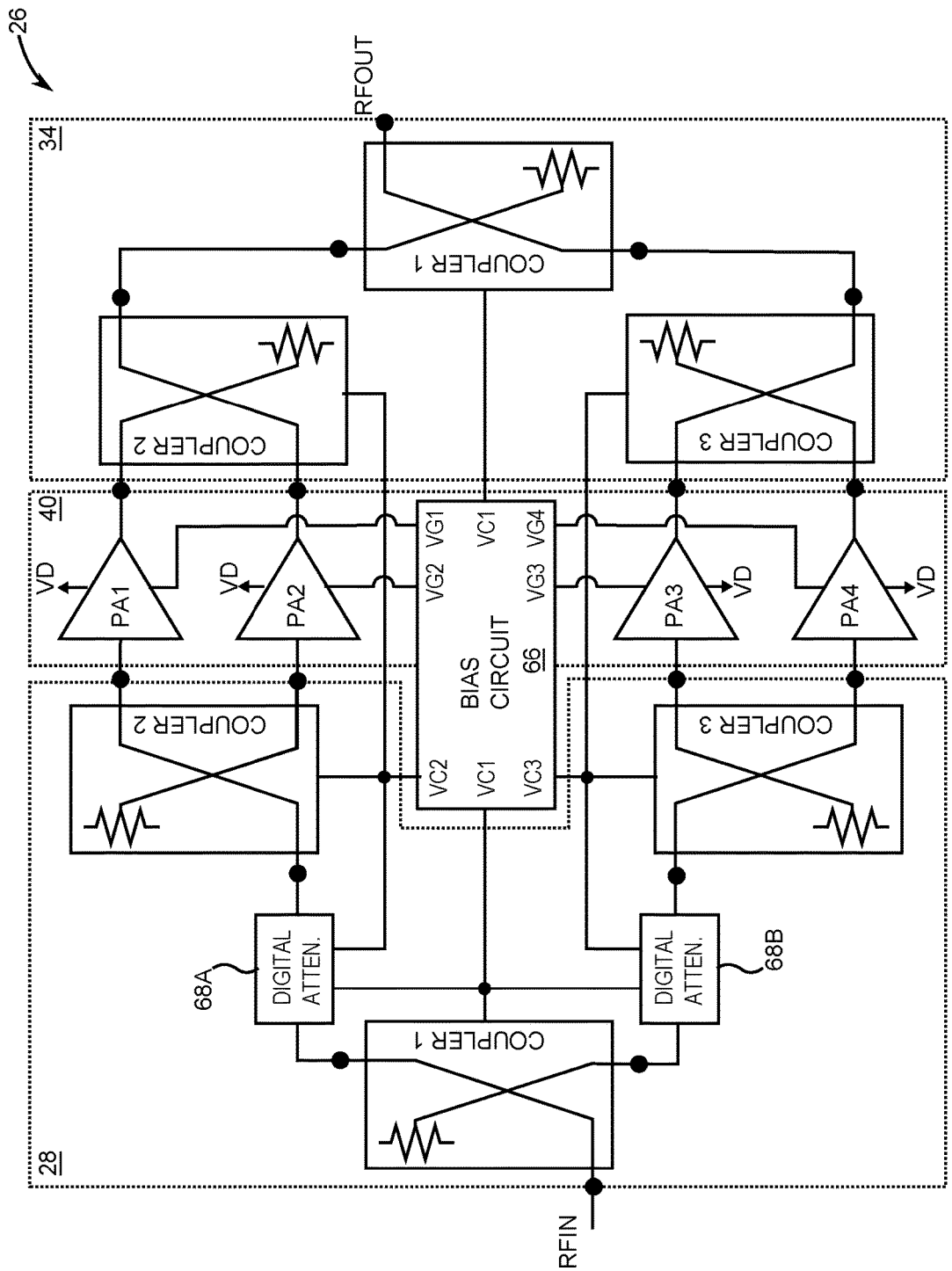
FIG. 12A is a schematic of a four-level power reconfigurable power amplifier that is structured in accordance with the present disclosure.

The four-level power version of reconfigurable power amplifier 26 (FIG. 5) is illustrated in FIG. 12A. The four power amplifiers 40 are identical but have separate gate bias connections such that they can be individually deactivated. A bias circuit 66 provides gate bias to the power amplifiers 40 (PA1, PA2, PA3 and PA4). Gate bias for the power amplifiers 40 is set to about −0.4 V when operating and more negative than ~1.2 V when deactivated. The three input-side reconfigurable couplers 28 and the three output-side reconfigurable couplers 34 each require independent control voltages (Vc1, Vc2, and Vc3) toggling between 0 V and −4 V. Control circuitry such as the controller 60 (FIGS. 6A and 6B) can be designed to simultaneously deactivate the power amplifiers as the power is reconfigured from one state to the next.

Optional digital trim step attenuators 68A and 68B are shown after the leftmost one of the input-side couplers 28 and are used to adjust the gain for the small differences in loss between the balanced, through, and coupled states. For this example, the optimum attenuator steps were found to be 0.16 dB and 0.38 dB for Vc1 and Vc3, respectively. The attenuator bits are constructed of a small switch FET in series with a resistor to ground. To add attenuation, the switch FET is biased ON by applying approximately 0 V to the gate. For the no attenuation state, a voltage less than ~2 V is applied to the gate of the switch FET, placing it in the OFF state. Like the power amplifier gate voltages, the attenuator bias voltages can be generated from the coupler control voltages.

Figure 12B:
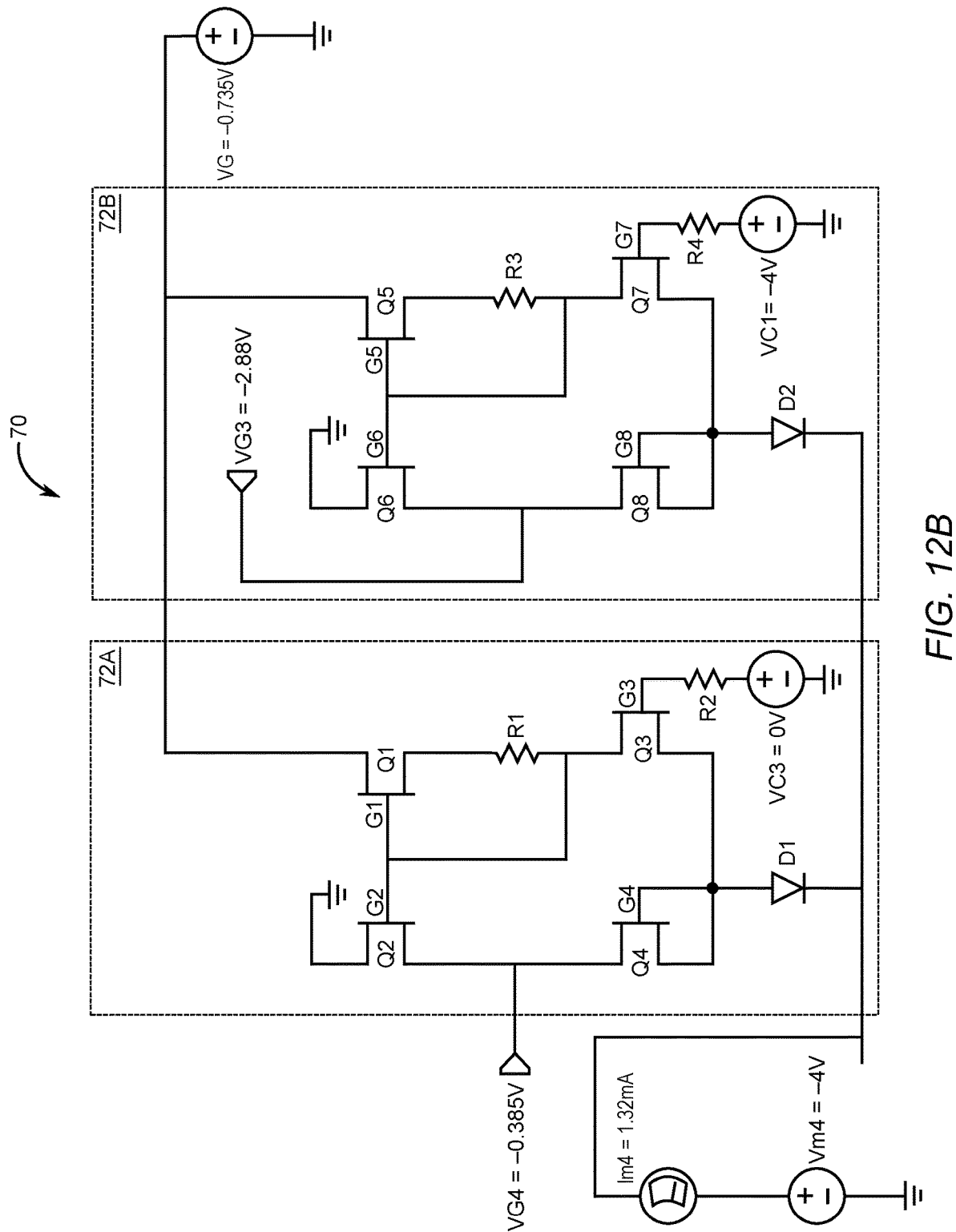
FIG. 12B is a schematic of a notional power amplifier gate bias circuitry that is structured in accordance with the present disclosure.

An example for a power amplifier gate bias circuitry 70 is shown in FIG. 12B. The power amplifier gate bias circuitry 70 is designed to control the bottom two amplifiers, PA3 and PA4 (FIG. 12A). The power amplifier gate bias circuitry 70 includes a first bias generator 72A and a second bias generator 72B. The first bias generator 72A has a first transistor Q1 and a second transistor Q2 having gates G1 and G2 that are connected together. A first resistor R1 is connected between the first transistor Q1 and a third transistor Q3 that has a gate G3 that is connected through a second resistor R2 to a control voltage VC3. The gates G1 and G2 are connected to the third transistor Q3 at a node between the third transistor Q3 and the first resistor R1. A fourth transistor Q4 is connected in series with the second transistor Q2, which is connected to ground. The third transistor Q3 and the fourth transistor Q4 are coupled to a voltage source Vm4 through a first diode D1. A gate G4 of the fourth transistor Q4 is coupled to an anode of the first diode D1.

The second bias generator 72B has a fifth transistor Q5 and a sixth transistor Q6 having gates G5 and G6 that are connected together. A third resistor R3 is connected between the fifth transistor Q5 and a seventh transistor Q7 that has a gate G7 that is connected through a fourth resistor R4 to a control voltage VC1. The gates G5 and G6 are connected to the seventh transistor Q7 at a node between the seventh transistor Q7 and the third resistor R3. An eighth transistor Q8 is connected in series with the sixth transistor Q6, which is connected to ground. The seventh transistor Q7 and the eighth transistor Q8 are coupled to the voltage source Vm4 through a second diode D2. The gate G8 of the eighth transistor Q8 is coupled to an anode of the second diode D2. A voltage source VG is connected between both the first transistor Q1 and the fifth transistor Q5 and ground.

Figure 13A:
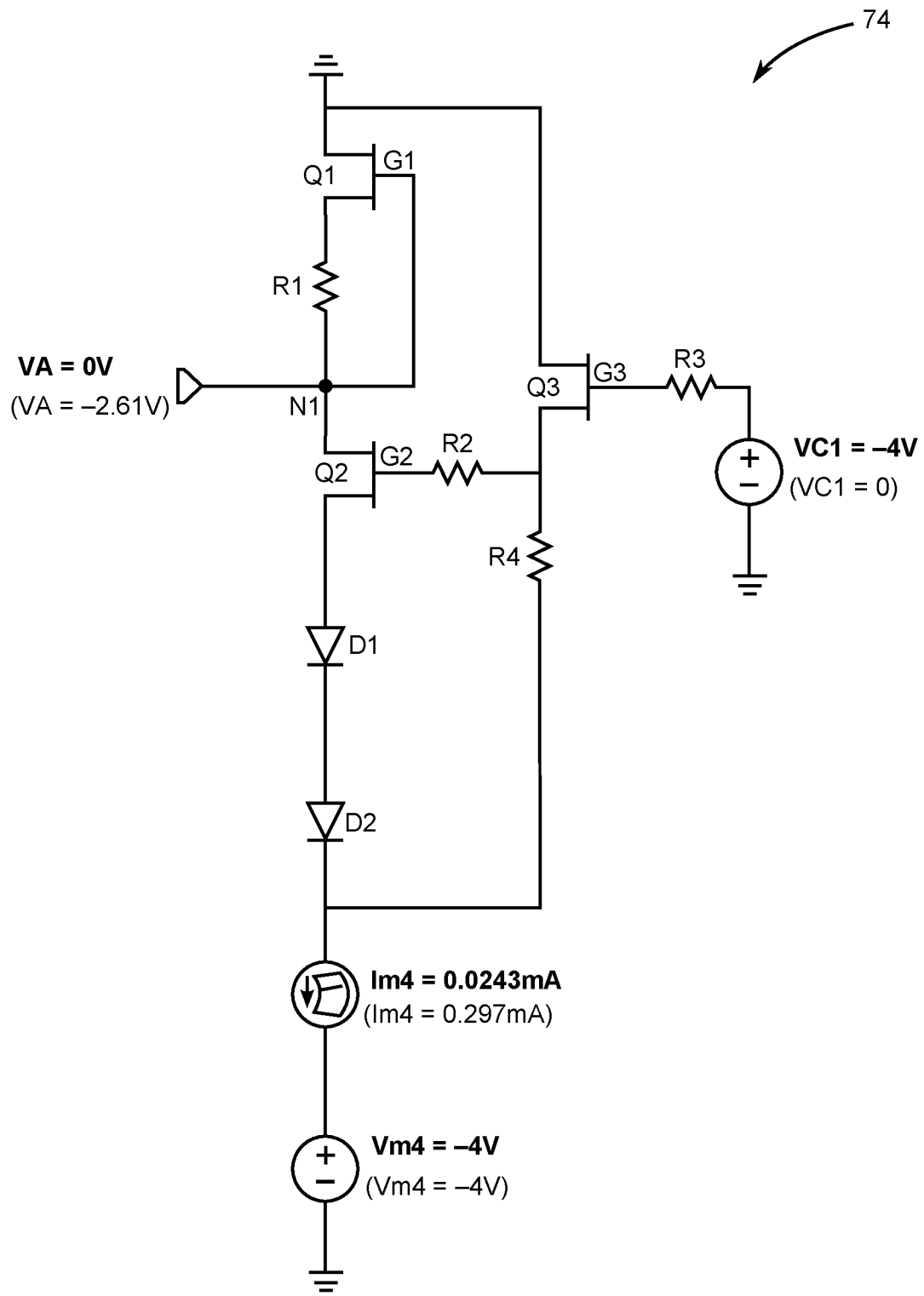
FIG. 13A is a schematic of a trim attenuator bias circuit that is structured in accordance with the present disclosure.
Figure 13B:
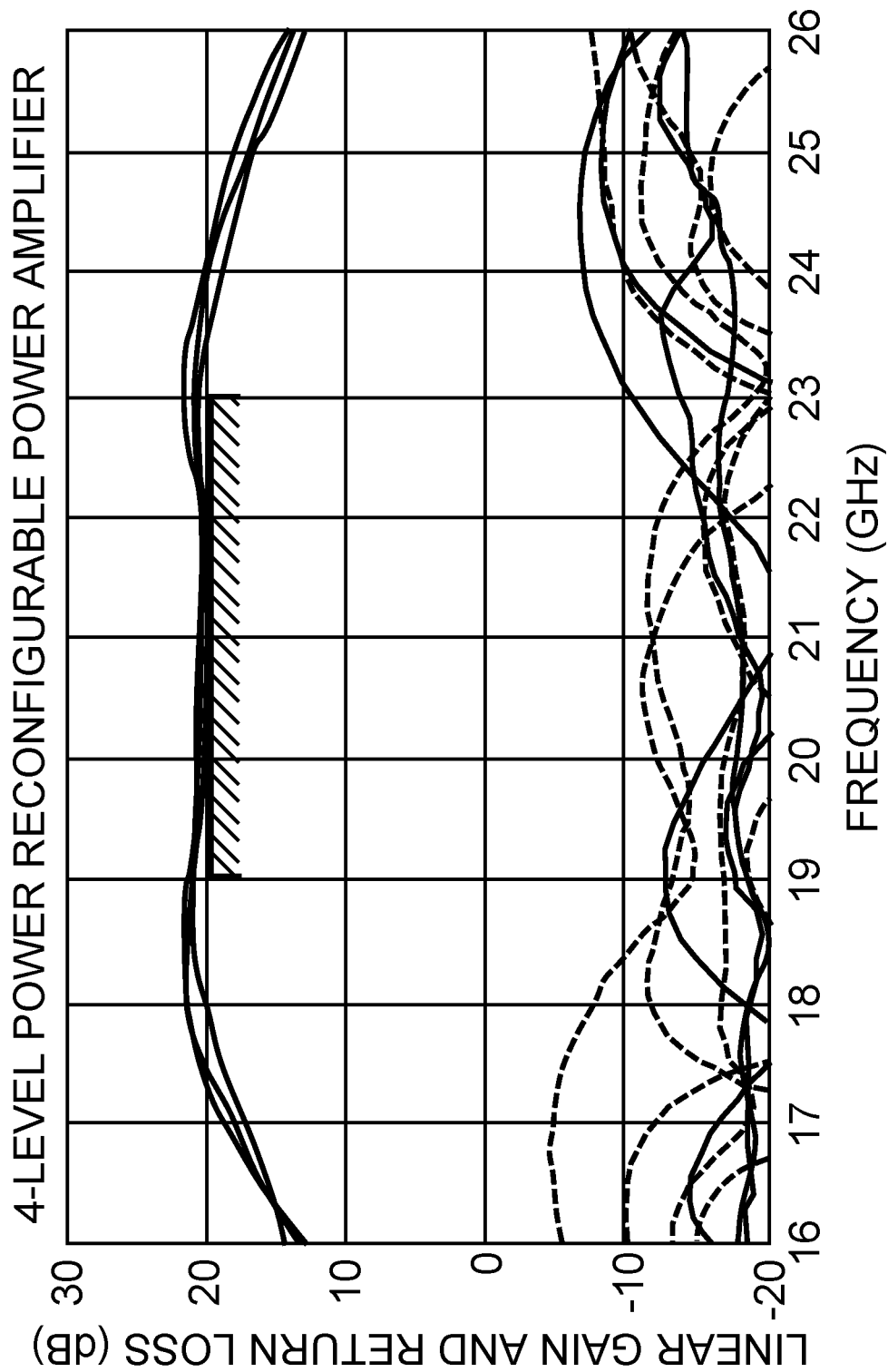
FIG. 13B is a plot of simulated gain and return loss for operation of the four-level power reconfigurable power amplifier of FIG. 12A.

In FIG. 12B, the control voltages are set to Vc1=−4 V and Vc3=0 V, which is either the 75% or 50% output power state. Note that PA4 in FIG. 12A turns ON with a gate voltage of −0.385 V. The gate voltage for PA4 is −2.88 V, which disables this amplifier. An attenuator bias circuit 74 is shown in FIG. 13A illustrating ON (VA=0 V) and OFF (VA<−2 V) state settings. The attenuator bias circuit 74 includes a first transistor Q1 connected to ground with a first resistor R1 connected between a second transistor Q2 and the first transistor Q1. A gate G1 of the first transistor Q1 is coupled to a node N1 between the first resistor R1 and the second transistor Q2. A first diode D1 and a second diode D2 are connected in series between the second transistor Q2 and a voltage source Vm4. A third transistor Q3 is connected between ground and a gate G2 of the second transistor Q2 through a second resistor R2. A gate G3 of the third transistor Q3 is connected to a control voltage VC1 through a third resistor R3. A fourth resistor R4 is connected between the third transistor Q3 and the voltage source Vm4. Voltages for a first simulation are depicted in bold type, and voltages for a second simulation are listed within parentheses. Simulated results for the small signal gain and return loss of the reconfigurable power amplifier are shown in FIG. 13B. Over the design band the linear gain is greater than 20 dB with better than 10 dB input/output return loss. Note that the gain is well matched state to state.

Figure 14A:
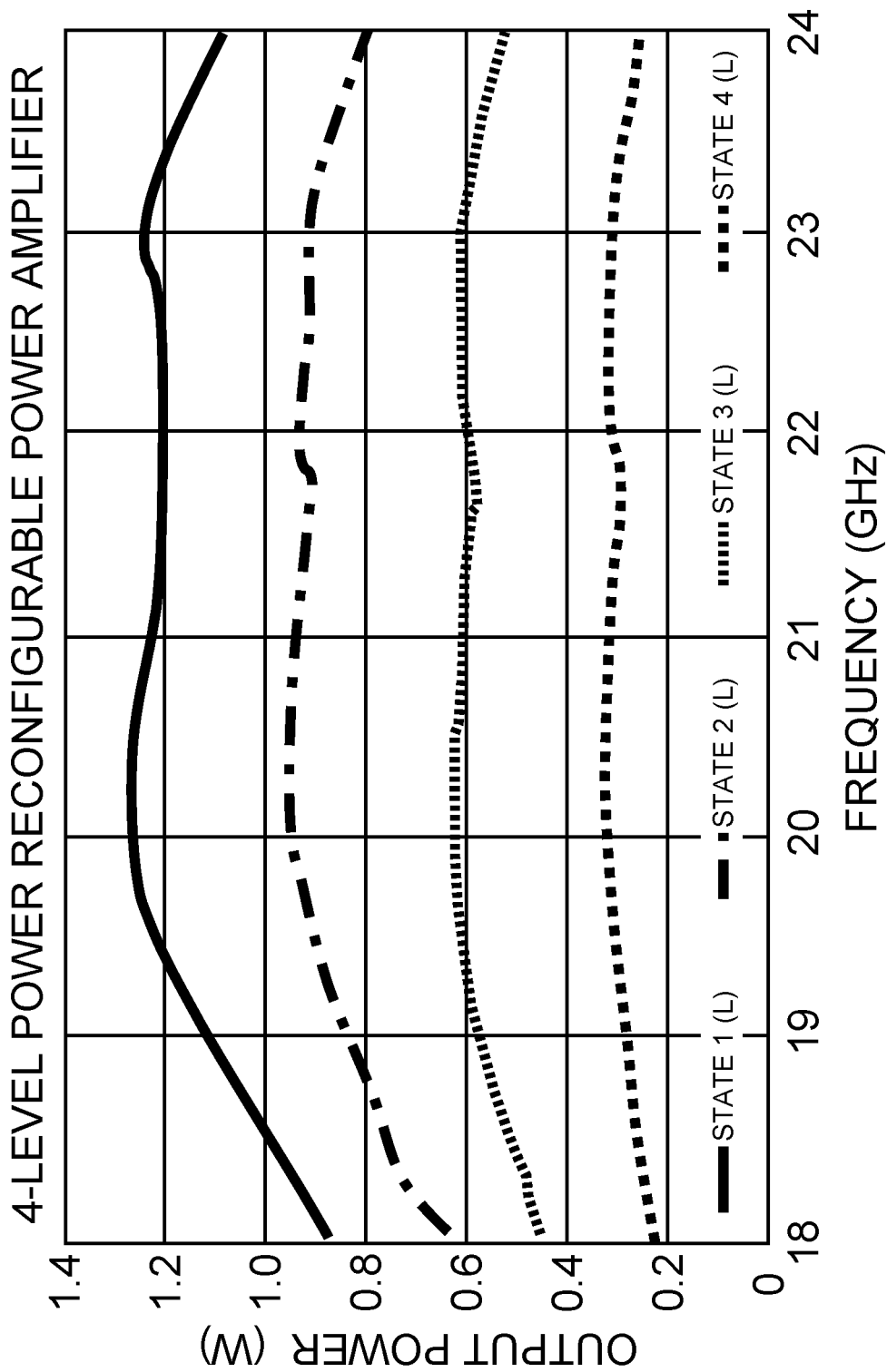
FIG. 14A is a plot of simulated output power for operation of the four-level power reconfigurable power amplifier of FIG. 12A.
Figure 14B:
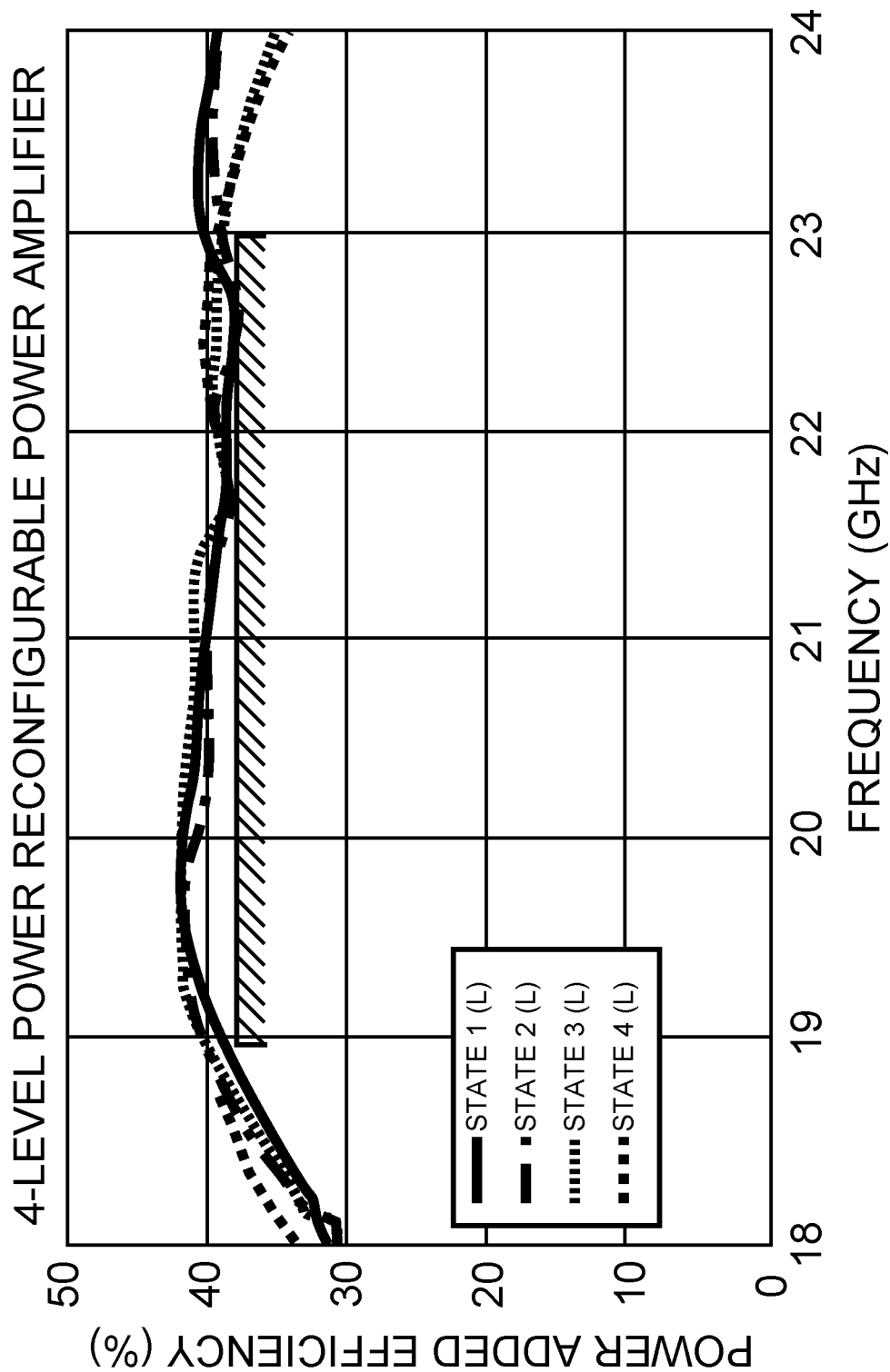
FIG. 14B is a plot of simulated power added efficient for operation of the four-level power reconfigurable power amplifier of FIG. 12A.
Figure 15A:
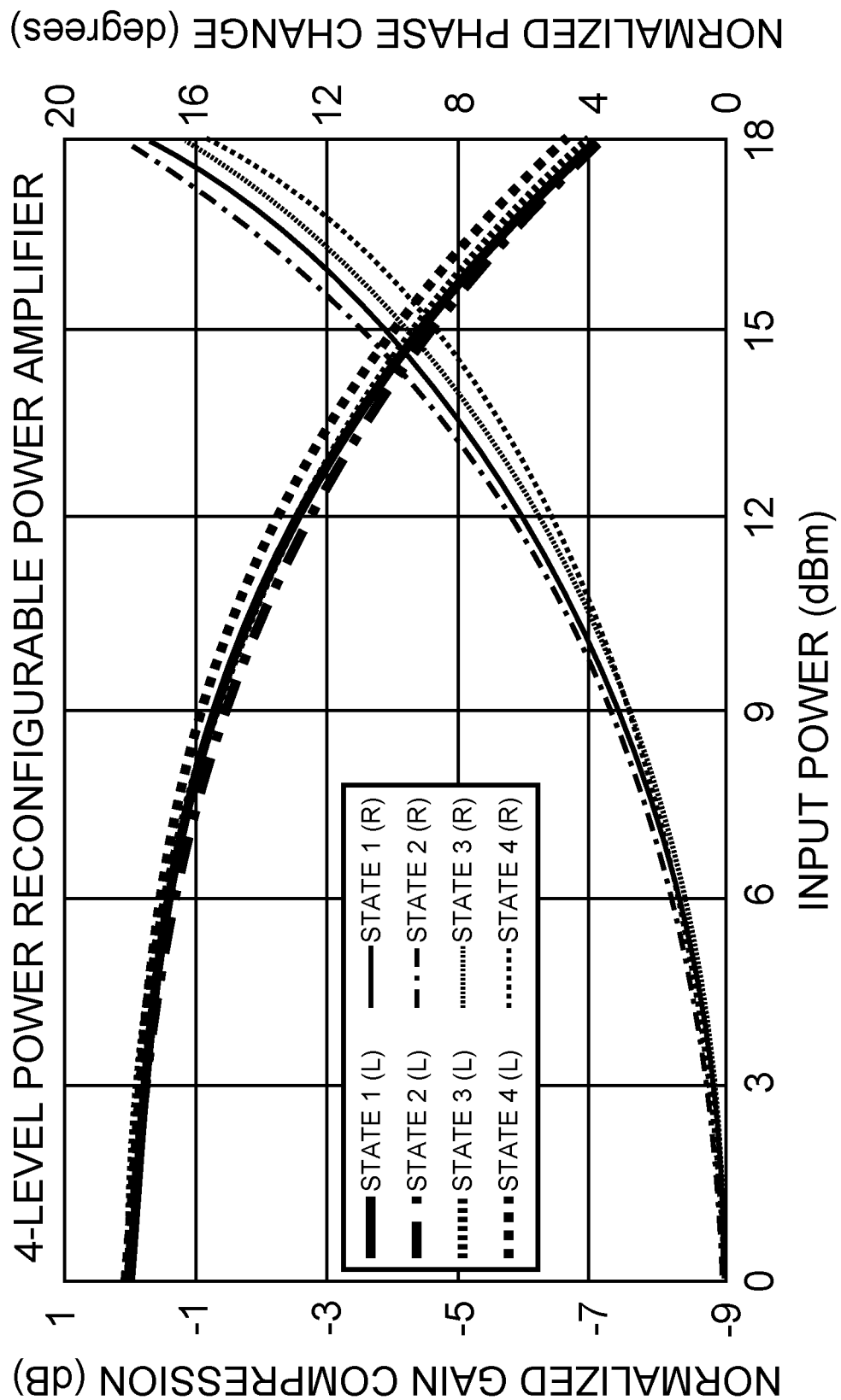
FIG. 15A is a plot of simulated normalized gain compression and phase shift versus input power for operation of the four-level power reconfigurable power amplifier of FIG. 12A.

The predicted saturated output power for the four-level power amplifier is plotted in FIG. 14A. The input power was 15 dBm for the highest power state and is reduced by 25% for each of the lower power states. The four programable output power states are evident, each being approximately 25% less than the next highest state referenced to the 100% state. The 100% power state varies between 1.1 W and 1.25 W over the 19 GHz to 23 GHz design band. Simulated PAE results are shown in FIG. 14B. The efficiency varies between 37.6% and 41.8% over the 19 GHz to 23 GHz operating frequency band. This is consistent with the stand-alone power amplifier simulation and the known loss of the reconfigurable couplers. Like the linear gain, the PAE is fairly consistent state to state. Note the lower output power settings do not suffer significant reductions in PAE Another characteristic that is of particular importance to phased arrays used for communication systems is how well the AM/AM and AM/PM characteristics track state to state. Simulated results for these parameters at 21 GHz are plotted in FIG. 15A. The curves at other frequencies between 19 GHz and 23 GHz look similar. The AM/AM curves track each other within a worst case of ±0.25 dB, which occurs at maximum compression level. The simulated normalized AM/PM results at 21 GHz track within a ±1.5° window. This is well under the resolution of most digital phase shifters. The high degree of demonstrated AM/AM and AM/PM matching is probably not possible using four individual power amplifier designs. The amplifiers would have to be co-designed; performance would likely be sacrificed, and a lesser degree of tracking would probably result. In other words, it is not clear that individually optimized amplifiers would produce higher overall efficiency after an acceptable level transfer characteristic matching was achieved.

Figure 15B:
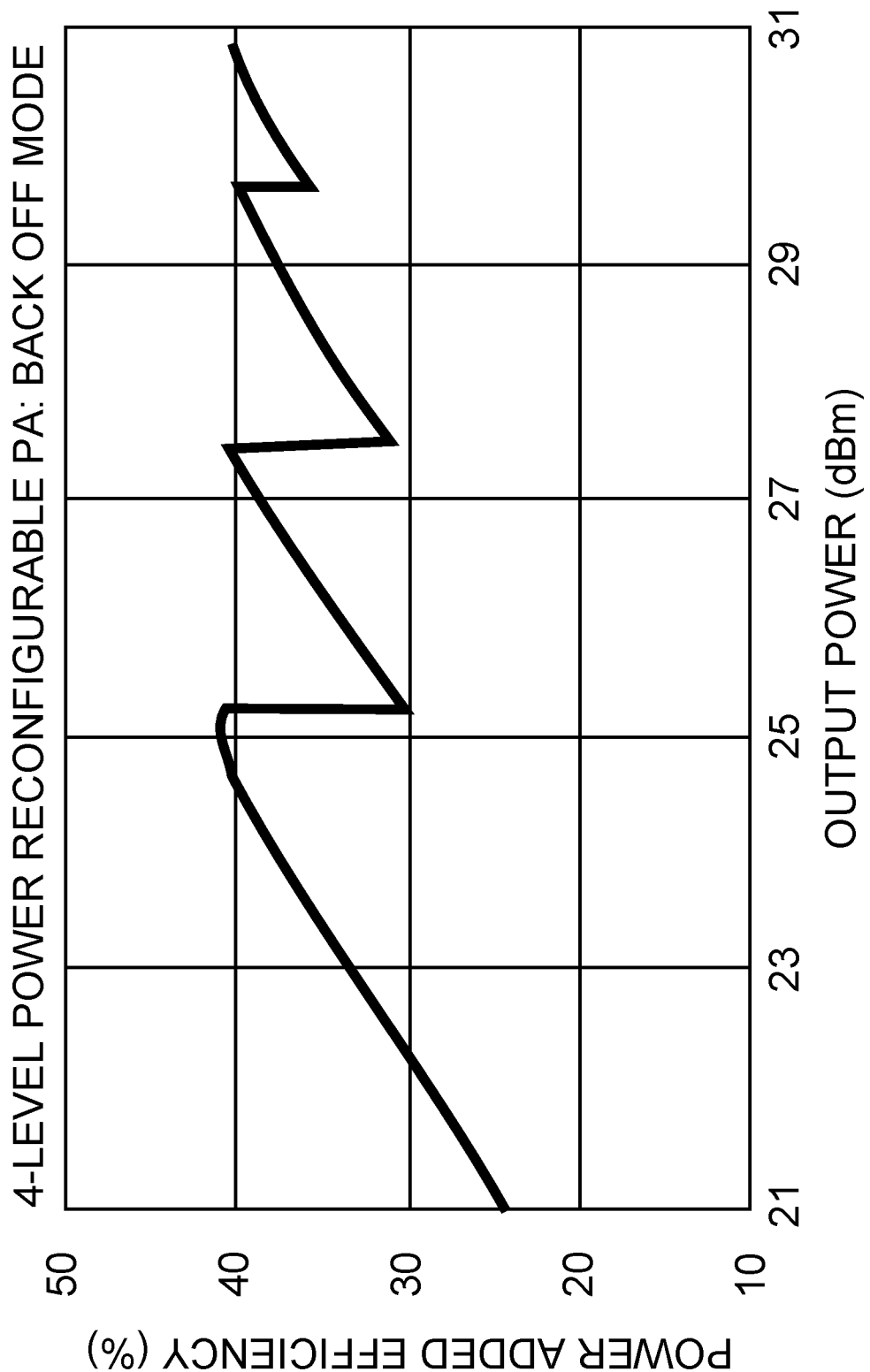
FIG. 15B is a plot of simulated power added efficiency versus output power for back-off operation of the four-level power reconfigurable power amplifier of FIG. 12A.

The output power levels are not fixed for the reconfigurable power amplifier, enabling a programable array taper for highly flexible array design and operation. An output power backoff mode of operation is illustrated in FIG. 15B. The amplifier is predicted to maintain greater than 30% PAE over an 8.5 dB range by sequentially switching to lower power states.

A power reconfigurable power amplifier and bias control circuitry have been described and theoretically demonstrated. The architecture utilizes the quadrature, through, and coupled modes of the reconfigurable Lange coupler. Quadrature phase relationship between these operating modes enables the use of these circuits in a balanced amplifier architecture having N nested pairs of couplers, $2^N$ constituent power amplifiers, and $2^N$ reconfigurable output power levels. Radio frequency switch field effect transistors (FETs) are utilized in reconfigurable matching networks to generate the impedances required to produce the necessary operating modes to reconfigure the output power of the amplifier. A notional four-level reconfigurable 19 GHz to 23 GHz power amplifier was designed and simulated to demonstrate the advantages of the architecture. The four identical power amplifiers are assumed to be monolithically implemented, resulting in matched input/output characteristics as the output power is reconfigured. This includes small gain, PAE, constituent power amplifier power consumption, constituent power amplifier power dissipation, and AM/AM and AM/PM large signal transfer characteristics. The advantages of this amplifier in a large phased array include, but are not necessarily limited to, the following:

1. $2^N$ electronically reconfigurable output power levels from a single component
2. Maintenance of good efficiency for all power levels
3. Similar gain and passband shape for all power levels
4. Reduced part count as all power amplifiers can have the same RF/direct current interface boards
5. Constituent power amplifiers can be deactivated with gate bias; no precise control over the high power supply is necessary
6. Matched large signal transfer characteristics as the power amplifier is reconfigured
7. Reconfigurable array power taper capability to actively control side lobe levels, antenna pattern and thermals.

Those skilled in the art will recognize improvements and modifications to the preferred embodiments of the present disclosure. All such improvements and modifications are considered within the scope of the concepts disclosed herein and the claims that follow.

What is claimed is:

1. A reconfigurable power amplifier comprising:
   a $2^N-1$ number of input-side reconfigurable quadrature couplers connected in a tree structure, wherein a $2^{(N-1)}$ number of the input-side reconfigurable quadrature couplers have coupler output terminals, and a root of the tree structure is one of the input-side reconfigurable quadrature couplers having a main input terminal;
   a $2^N-1$ number of output-side reconfigurable quadrature couplers connected in a tree structure, wherein the $2^{(N-1)}$ number of the output-side reconfigurable quadrature couplers have coupler input terminals, and a root of the tree structure is one of the output-side reconfigurable quadrature couplers having a main output terminal; and
   a $2^N$ number of constituent amplifiers divided into amplifier pairs having amplifier input terminals connected to corresponding ones of the coupler output terminals and having amplifier output terminals coupled to corresponding ones of the coupler input terminals, wherein N is a natural counting number greater than or equal to two, and each of the input-side and output-side reconfigurable quadrature couplers comprises:
   a first port transmission line connected to a first port;
   a second port transmission line;
   a second port transformer connected between the second port transmission line and a second port, wherein the second port transformer is configured to have a selectable second port reflection coefficient $\Gamma_2$;
   a third port transmission line;
   a third port transformer connected between the third transmission line and a third port, wherein the third port transformer is configured to have a selectable third port reflection coefficient $\Gamma_3$;
   a fourth port transmission line; and
   a fourth port transformer connected between the fourth port transmission line and a fourth port, wherein the fourth port transformer is configured to have a selectable fourth port reflection coefficient $\Gamma_4$.

2. The reconfigurable power amplifier of claim 1 wherein $2^N$ output power levels are provided by the reconfigurable power amplifier.

3. The reconfigurable power amplifier of claim 1 wherein each tree structure is a perfect tree structure.

4. The reconfigurable power amplifier of claim 1 wherein the second port transmission line, the third port transmission line, and the fourth port transmission line comprise a Lange coupler structure.

5. The reconfigurable power amplifier of claim 1 wherein a quadrature mode is activated when the selectable second port reflection coefficient, the selectable third port reflection coefficient, and the selectable fourth port reflection coefficient are all substantially equal to zero.

6. The reconfigurable power amplifier of claim 5 wherein insertion loss of the reconfigurable quadrature coupler is less than 0.5 dB for the quadrature mode of operation.

7. The reconfigurable power amplifier of claim 1 wherein a through mode is activated when the selectable second port reflection coefficient and the selectable third port reflection coefficient are substantially equal to 1, while the selectable fourth port reflection coefficient is substantially equal to one-third.

8. The reconfigurable power amplifier of claim 7 wherein insertion loss is less than 0.7 dB over a 4 GHz bandwidth centered at 21 GHz for the through mode of operation.

9. The reconfigurable power amplifier of claim 7 wherein a phase error for the through mode referenced to a corresponding balanced mode is less than 6°.

10. The reconfigurable power amplifier of claim 1 wherein a coupled mode is activated when the selectable second port reflection coefficient is substantially equal to one-third and the selectable third port reflection coefficient is substantially equal to −1, while the selectable fourth port reflection coefficient is substantially equal to 1.

11. The reconfigurable power amplifier of claim 10 wherein insertion loss is less than 0.7 dB over a 4 GHz bandwidth centered at 21 GHz for the coupled mode of operation.

12. The reconfigurable power amplifier of claim 10 wherein a phase error for the coupled mode referenced to a corresponding balanced mode is less than 6°.

13. The reconfigurable power amplifier of claim 1 wherein the second port transformer includes at least one switchable impedance branch that is selectively activated by at least one transistor switch.

14. The reconfigurable power amplifier of claim 1 wherein the third port transformer includes at least one switchable impedance branch that is selectively activated by at least one transistor switch.

15. The reconfigurable power amplifier of claim 1 wherein the fourth port transformer includes at least one switchable impedance branch that is selectively activated by at least one transistor switch.

16. The reconfigurable power amplifier of claim 1 wherein each of the second port transformer, the third port transformer, and the fourth port transformer includes at least one switchable impedance branch that is selectively activated by at least one transistor switch.

17. The reconfigurable power amplifier of claim 16 wherein the at least one transistor switch is a radio frequency switch field-effect transistor.

18. The reconfigurable power amplifier of claim 1 further comprising at least one digital trim step attenuator coupled to the leftmost one of the input-side reconfigurable quadrature couplers, wherein the at least one digital trim step attenuator is configured to adjust gain for the differences in loss between a balanced state, a through state, and a coupled state.

19. The reconfigurable power amplifier of claim 1 wherein the $2^N$ number of constituent amplifiers are monolithic with substantially matched input/output performance characteristics.

20. The reconfigurable power amplifier of claim 1 wherein phases for a through mode satisfies $e^{j\Phi_2} - |\Gamma_4|e^{j\Phi_4} - 2|\Gamma_2|e^{j(\Phi_2+\Phi_3+\Phi_4)} = 0$.

21. The reconfigurable power amplifier of claim 1 wherein phases for a coupled mode satisfies $|\Gamma_2|e^{j\Phi_2} - e^{j\Phi_4} - 2|\Gamma_2|e^{j(\Phi_2+\Phi_3+\Phi_4)} = 0$.

* * * * *

UNITED STATES PATENT AND TRADEMARK OFFICE
CERTIFICATE OF CORRECTION

PATENT NO. : 12,040,759 B2
APPLICATION NO. : 17/365672
DATED : July 16, 2024
INVENTOR(S) : Charles Forrest Campbell It is certified that error appears in the above-identified patent and that said Letters Patent is hereby corrected as shown below:

In the Specification

In Column 5, Line 64, replace "a 500 termination" with --a 50Ω termination--.

In Column 6, Line 5, replace "$e^{j\phi_2} - |\Gamma_4|e^{j\phi_4} - 2|\Gamma_2|e^{j(\phi_2+\phi_3+\phi_4)} = 0$," with --$e^{j\phi_2} - |\Gamma_4|e^{j\phi_4} - 2|\Gamma_4|e^{j(\phi_2+\phi_3+\phi_4)} = 0$--.

In Column 6, Line 35, replace "another 500 isolation" with --another 50Ω isolation--.

In Column 11, Line 21, replace "~1.2 V" with -- −1.2 V--.

In Column 11, Line 38, replace "less than ~2" with --less than −2--.

In Column 12, Line 9, replace "Vc1=—4 V" with --Vc1=−4 V--.

Signed and Sealed this
Twentieth Day of August, 2024

Katherine Kelly Vidal
*Director of the United States Patent and Trademark Office*